United States Patent
Ryu et al.

(10) Patent No.: US 12,379,746 B2
(45) Date of Patent: Aug. 5, 2025

(54) DISPLAY DEVICE

(71) Applicant: Samsung Display Co., LTD., Yongin-si (KR)

(72) Inventors: Ji Hun Ryu, Hwaseong-si (KR); Kwang Hyun Baek, Asan-si (KR); Dong Hwan Lee, Yongin-si (KR); Chae Eun Lee, Seoul (KR); Jae Hyung Jo, Asan-si (KR); Jeong An Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 172 days.

(21) Appl. No.: 17/579,500

(22) Filed: Jan. 19, 2022

(65) Prior Publication Data

US 2022/0230467 A1 Jul. 21, 2022

(30) Foreign Application Priority Data

Jan. 20, 2021 (KR) ........................ 10-2021-0008042

(51) Int. Cl.
*G06F 1/16* (2006.01)
*G06V 40/13* (2022.01)
(Continued)

(52) U.S. Cl.
CPC ........ *G06F 1/1637* (2013.01); *G06V 40/1306* (2022.01); *G06V 40/1318* (2022.01);
(Continued)

(58) Field of Classification Search
CPC ............ G06V 40/1306; G06V 40/1318; G06F 1/1626; G06F 1/1637; G06F 1/1641;
(Continued)

(56) References Cited

U.S. PATENT DOCUMENTS 9,323,393 B2    4/2016  Djordjev et al.
10,488,693 B2 *  11/2019 Lee ........................ G06F 1/1686
(Continued)

FOREIGN PATENT DOCUMENTS

EP    3382514    10/2018
EP    3661173    6/2020
(Continued)

OTHER PUBLICATIONS

Extended European Search Report dated Jun. 27, 2022, issued in European Patent Application No. 22152441.6.

*Primary Examiner* — Peter D McLoone
(74) *Attorney, Agent, or Firm* — Womble Bond Dickinson (US) LLP

(57) ABSTRACT

A display device includes a display panel; a metal plate and a filling member which are disposed on a lower surface of the display panel, are disposed on the same layer, and include different materials; and a fingerprint sensor which is disposed on a lower surface of the filling member and is overlapped by the filling member in a thickness direction, wherein the metal plate includes a plurality of outlines extending in different directions in plan view, one outline of the metal plate includes a plurality of sides extending along a first direction and a discontinuous part disposed between the sides, an open part recessed from the discontinuous part in a second direction intersecting the first direction is formed in the metal plate, and the filling member is located in the open part in plan view.

26 Claims, 21 Drawing Sheets

(51) Int. Cl.
*H10K 59/131* (2023.01)
*H10K 59/65* (2023.01)
*H10K 77/10* (2023.01)
*H10K 102/00* (2023.01)

(52) U.S. Cl.
CPC .......... *H10K 59/131* (2023.02); *H10K 59/65* (2023.02); *H10K 77/111* (2023.02); *H10K 2102/311* (2023.02)

(58) Field of Classification Search
CPC ............... G06F 1/1652; G06F 1/1684; H10K 2102/311; H10K 59/131; H10K 59/65; H10K 77/111
See application file for complete search history.

(56) References Cited

U.S. PATENT DOCUMENTS

| | | | |
|---|---|---|---|
| 10,929,635 B2* | 2/2021 | Kwon | G01B 17/06 |
| 11,204,627 B2 | 12/2021 | Park | |
| 12,045,087 B2* | 7/2024 | Jo | G02B 27/28 |
| 2007/0253606 A1* | 11/2007 | Higuchi | G06V 40/1318 |
| | | | 382/124 |
| 2013/0277650 A1* | 10/2013 | Yoneya | H10K 59/131 |
| | | | 257/40 |
| 2015/0198699 A1* | 7/2015 | Kuo | G01S 15/02 |
| | | | 367/7 |
| 2016/0357052 A1* | 12/2016 | Kim | G02F 1/133305 |
| 2017/0154947 A1* | 6/2017 | Nakamura | H10K 77/111 |
| 2017/0212613 A1* | 7/2017 | Hwang | G06F 1/1684 |
| 2018/0284512 A1* | 10/2018 | Lee | G06F 1/1626 |
| 2019/0073505 A1* | 3/2019 | Kwon | G06V 40/1306 |
| 2019/0131553 A1* | 5/2019 | Park | G06F 1/1652 |
| 2019/0251320 A1* | 8/2019 | Kim | G06V 40/1306 |
| 2019/0325188 A1* | 10/2019 | Jo | G06F 1/1684 |
| 2020/0168676 A1 | 5/2020 | Hu et al. | |
| 2020/0218311 A1* | 7/2020 | Park | H04M 1/0214 |
| 2021/0157362 A1* | 5/2021 | Jo | G06F 1/1637 |
| 2021/0174044 A1* | 6/2021 | Jo | H05K 9/0024 |
| 2021/0335900 A1* | 10/2021 | Ni | H10K 59/65 |

FOREIGN PATENT DOCUMENTS

| | | | | |
|---|---|---|---|---|
| EP | 3680749 | | 7/2020 | |
| WO | WO-2019112314 A1 * | 6/2019 | ............. | G01H 17/00 |
| WO | WO-2019203598 A1 * | 10/2019 | ............. | G02B 27/28 |
| WO | WO-2020040620 A1 * | 2/2020 | ................ | C09J 7/29 |

* cited by examiner

RS2: RS11, RS12

DISPLAY DEVICE

CROSS REFERENCE TO RELATED APPLICATION

This application claims priority from and the benefit of Korean Patent Application No. 10-2021-0008042, filed on Jan. 20, 2021, which is hereby incorporated by reference for all purposes as if fully set forth herein.

BACKGROUND

Field

Embodiments of the invention relate generally to a display device.

Discussion of the Background

Display devices are being applied to various electronic devices such as smartphones, tablets, notebook computers, monitors, and televisions. Recently, the development of mobile communication technology has greatly increased the use of portable electronic devices such as smartphones, tablets, and notebook computers. A portable electronic device stores privacy information. Therefore, fingerprint authentication is used to authenticate a fingerprint which is a user's biometric information in order to protect the privacy information of the portable electronic device. To this end, a display device may include a fingerprint sensor for fingerprint authentication.

A fingerprint sensor may be implemented as an optical, ultrasonic, or capacitive fingerprint sensor. A fingerprint sensor may be disposed under a display panel, and various members may be disposed between the display panel and the fingerprint senor. An incident signal transmitted from the fingerprint sensor is reflected from a user's fingerprint and then received by the fingerprint sensor in the form of a reflected signal.

The above information disclosed in this Background section is only for understanding of the background of the inventive concepts, and, therefore, it may contain information that does not constitute prior art.

SUMMARY

Aspects of the inventive concepts provide a display device which improves structural deformation due to thermal expansion of a filling member filling a through hole of a metal plate.

Additional features of the inventive concepts will be set forth in the description which follows, and in part will be apparent from the description, or may be learned by practice of the inventive concepts.

According to an aspect of the inventive concepts, there is provided a display device, the display device includes a display panel; a metal plate and a filling member which are disposed on a lower surface of the display panel, are disposed on the same layer, and include different materials; and a fingerprint sensor which is disposed on a lower surface of the filling member and is overlapped by the filling member in a thickness direction, wherein the metal plate includes a plurality of outlines extending in different directions in plan view, one outline of the metal plate includes a plurality of sides extending along a first direction and a discontinuous part disposed between the sides, an open part recessed from the discontinuous part in a second direction intersecting the first direction is formed in the metal plate, and the filling member is located in the open part in plan view.

According to another aspect of the inventive concepts, there is provided a display device, the display device includes a display panel which includes a first non-folding area, a second non-folding area located in a second direction of the first non-folding area, and a folding area located between the first non-folding area and the second non-folding area; a metal plate and a filling member which are disposed on a lower surface of the display panel, are disposed on the same layer, and include different materials; and a fingerprint sensor which is disposed on a lower surface of the filling member and is overlapped by the filling member in a thickness direction, wherein the filling member is located in the metal plate in plan view, and the metal plate includes a first metal plate overlapping the first non-folding area, a second metal plate overlapping the second non-folding area, and a third metal plate overlapping the folding area, wherein the third metal plate includes a plurality of first line patterns extending along a first direction intersecting the second direction, and the second metal plate includes a first sub-metal plate and a second sub-metal plate spaced apart in the second direction with the fingerprint sensor interposed therebetween and a third sub-metal plate disposed between the first sub-metal plate and the second sub-metal plate, wherein the third sub-metal plate includes second line patterns located on a second side of the fingerprint sensor in the first direction in plan view and third line patterns located on a first side of the fingerprint sensor in the first direction, wherein the second line patterns extend along the first direction and are spaced apart from each other in the second direction, and the third line patterns extend along the first direction and are spaced apart from each other in the second direction.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

Figure 17:
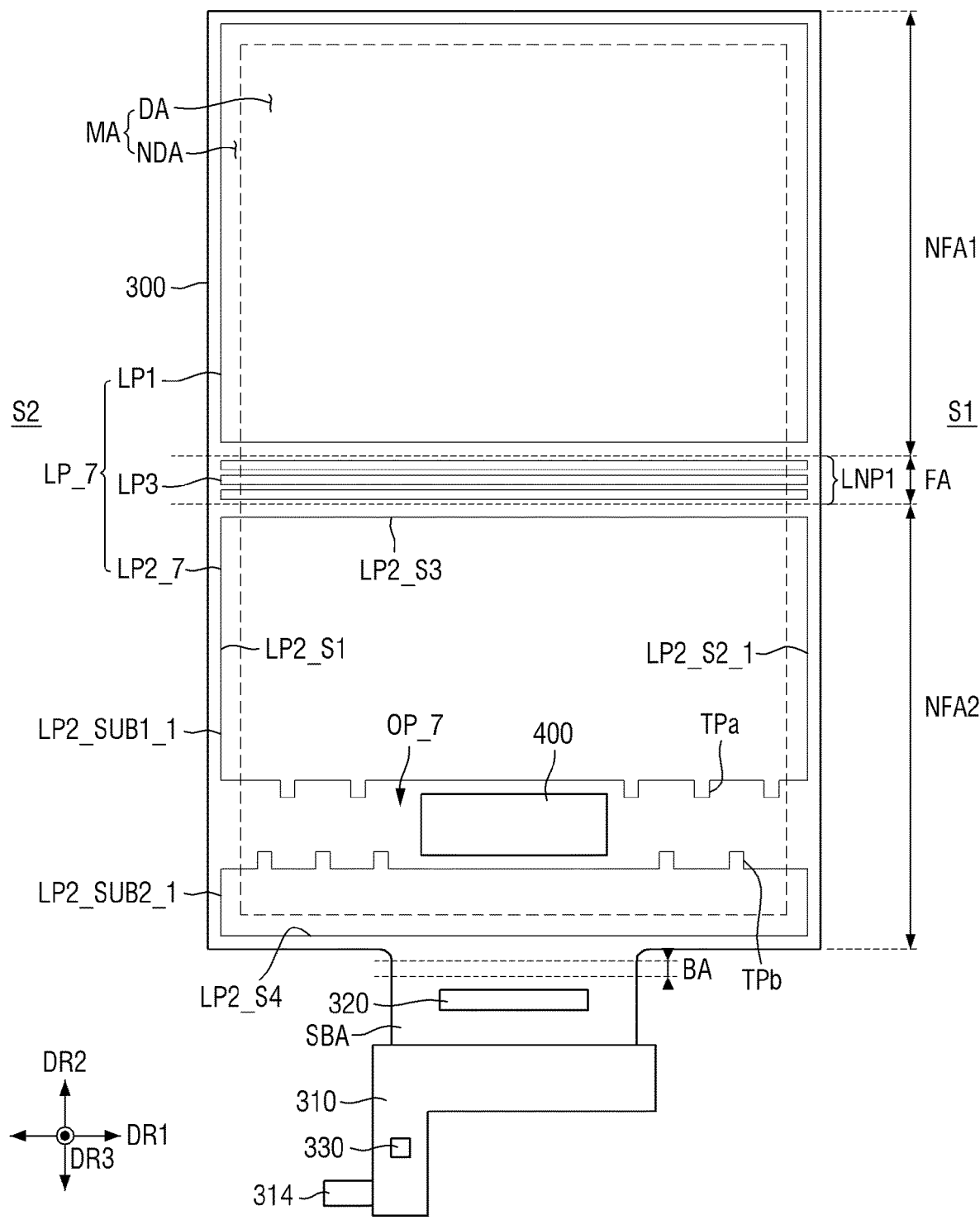
Figure 18:
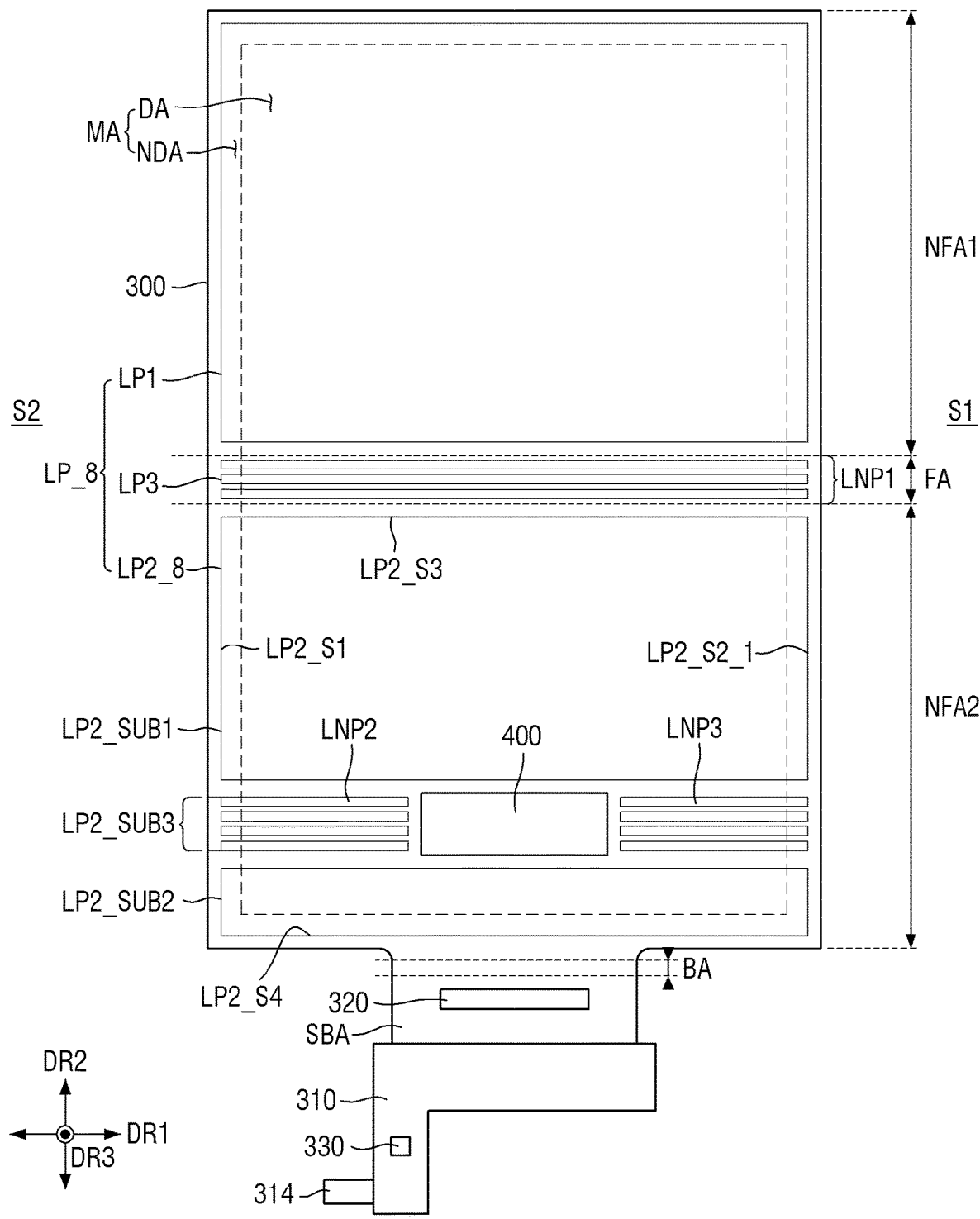
Figure 19:
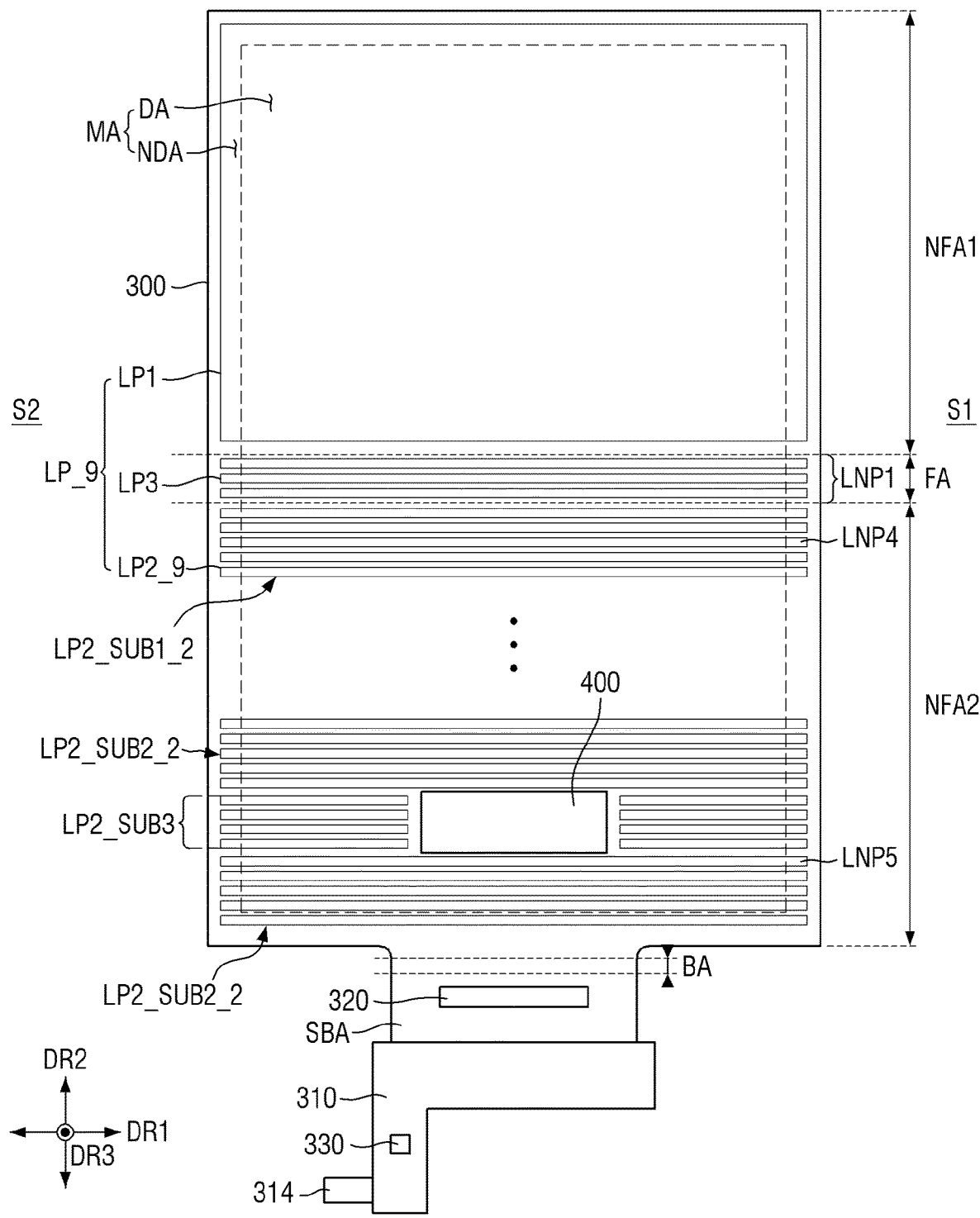
Figure 20:
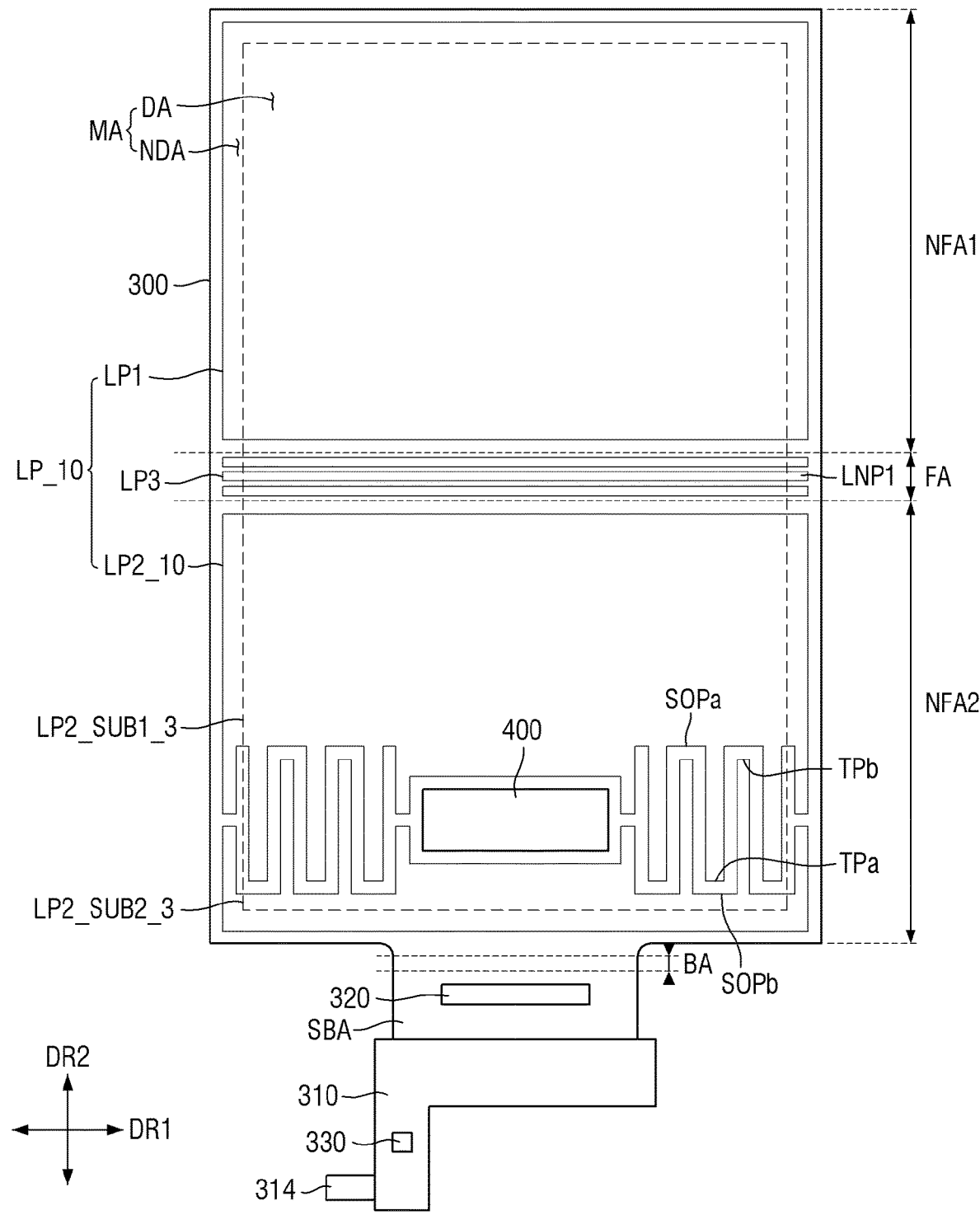
Figure 21:
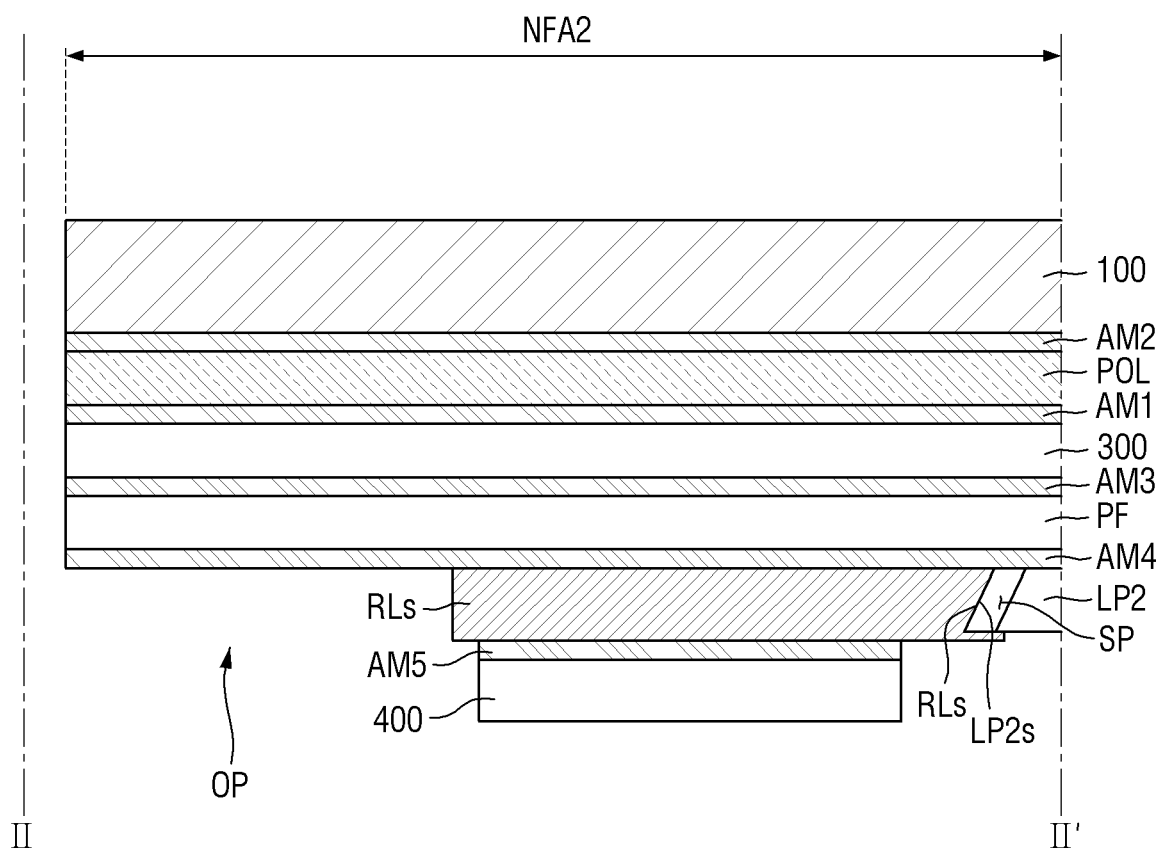

FIG, 16 is a plan view illustrating a display panel, a metal plate, a display circuit board, and a display driving circuit of a display device according to an embodiment;

FIG. 17 is a plan view illustrating a display panel, a metal plate, a display circuit board, and a display driving circuit of a display device according to an embodiment;

FIG. 18 is a plan view illustrating a display panel, a metal plate, a display circuit board, and a display driving circuit of a display device according to an embodiment;

FIG. 19 is a plan view illustrating a display panel, a metal plate, a display circuit board, and a display driving circuit of a display device according to an embodiment;

FIG. 20 is a plan view illustrating a display panel, a metal plate, a display circuit board, and a display driving circuit of a display device according to an embodiment; and FIG. 21 is a cross-sectional view illustrating a display device according to an embodiment.

DETAILED DESCRIPTION

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Advantages and features of the inventive concepts and methods of accomplishing the same may be understood more readily by reference to the following detailed description of exemplary embodiments and the accompanying drawings. The inventive concepts may, however, be embodied in many different forms and should not be construed as being limited to the embodiments set forth herein. Rather, these embodiments are provided so that this disclosure will be thorough and will convey the concept of the inventive concepts to those skilled in the art, and the inventive concepts will be defined by the appended claims.

It will be understood that when an element or layer is referred to as being "on" another element or layer, the element or layer can be directly on another element or layer or intervening elements or layers. Like numbers refer to like elements throughout. The shapes, sizes, ratios, angles, numbers, and the like illustrated in the drawings illustrating embodiments are merely examples, and the inventive concepts are not limited thereto.

It will be understood that, although the terms first, second, third, etc., may be used herein to describe various elements, these elements should not be limited by these terms. These terms are only used to distinguish one element from another element. Thus, a first element discussed below could be termed a second element without departing from the teachings of the inventive concepts.

Respective features of embodiments of the inventive concepts may be partially or entirely joined or combined with each other, and technically various linkages and driving may be possible. The embodiments may be implemented independently or in association with each other.

Hereinafter, specific embodiments will be described with reference to the accompanying drawings.

Figure 1:
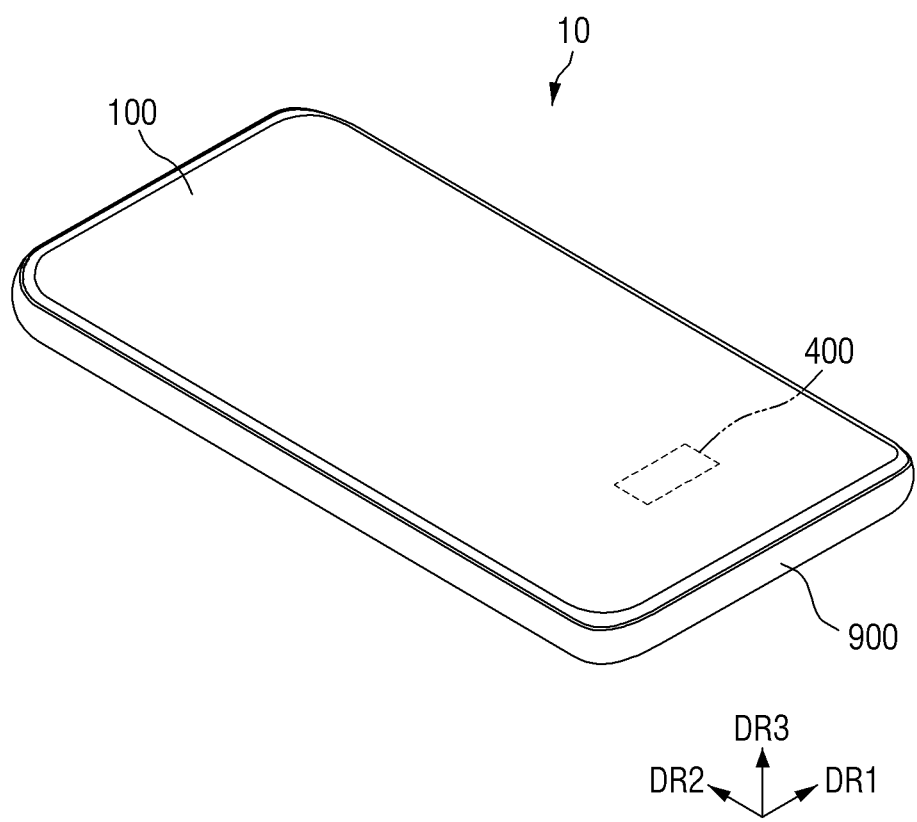
FIG. 1 is a perspective view illustrating a display device according to an embodiment.
Figure 2:
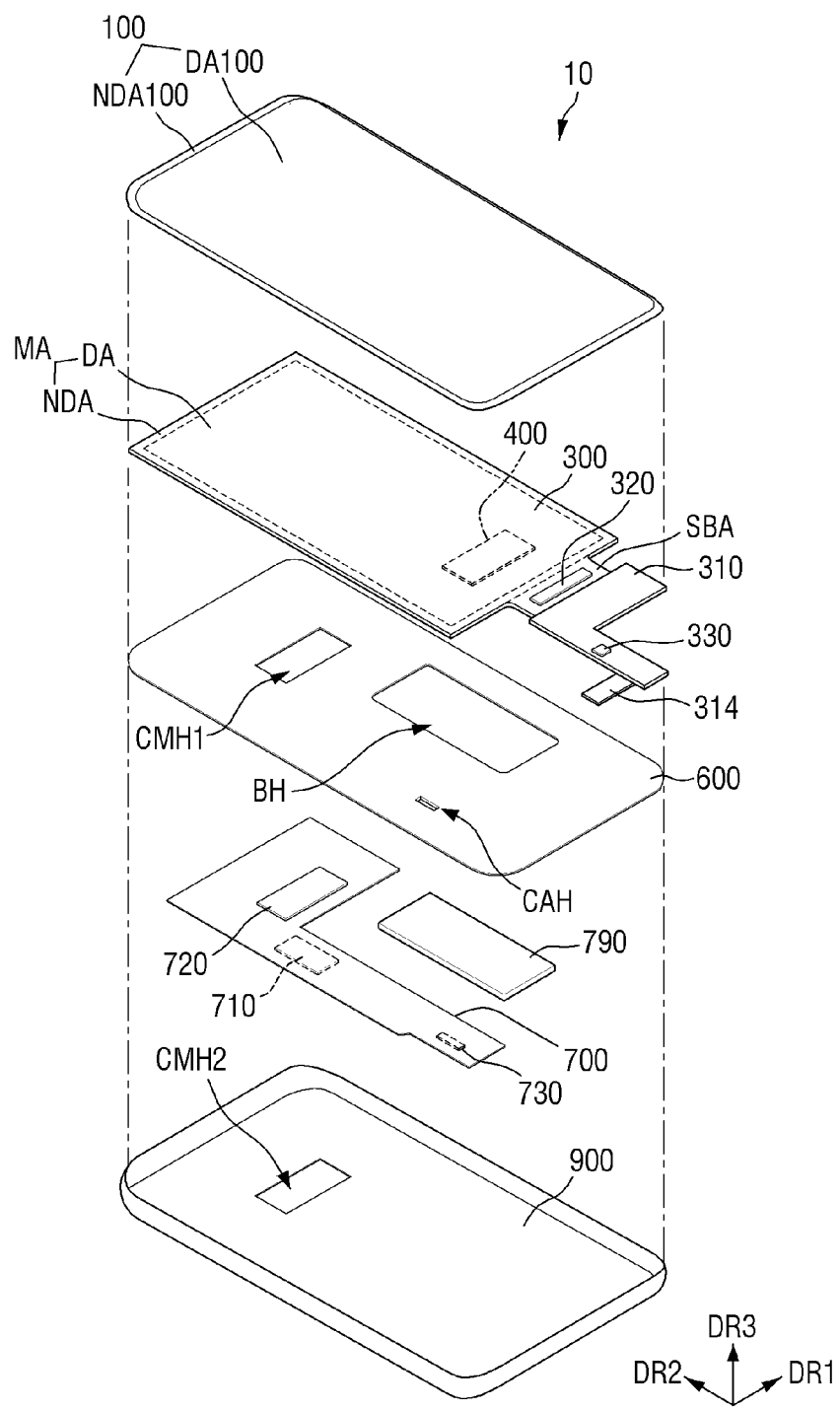
FIG. 2 is an exploded perspective view illustrating the display device according to the embodiment.

FIG. 1 is a perspective view illustrating a display device 10 according to an embodiment. FIG. 2 is an exploded perspective view illustrating the display device 10 according to the embodiment.

Referring to FIGS. 1 and 2, the display device 10 according to the embodiment may be applied to portable electronic devices such as mobile phones, smartphones, tablet personal computers (PCs), mobile communication terminals, electronic notebooks, electronic books, portable multimedia players (PMPs), navigation devices, and ultra-mobile PCs (UMPCs). Alternatively, the display device 10 according to the embodiment may be applied as a display unit of a television, a notebook computer, a monitor, a billboard, or the Internet of things (IoT). Alternatively, the display device 10 according to the embodiment may be applied to wearable devices such as smart watches, watch phones, glass-like displays, and head-mounted displays (HMDs). Alternatively, the display device 10 according to the embodiment may be applied to a dashboard of a vehicle, a center fascia of a vehicle, a center information display (CID) disposed on a dashboard of a vehicle, a room mirror display in place of a side mirror of a vehicle, or a display disposed on the back of a front seat as an entertainment for rear-seat passengers of a vehicle.

In the present specification, a first direction DR1 may be a short side direction of the display device 10, for example, a horizontal direction of the display device 10. A second direction DR2 may be a long side direction of the display device 10, for example, a vertical direction of the display device 10. A third direction DR3 may be a thickness direction of the display device 10.

The display device 10 may have a planar shape similar to a quadrangle. For example, the display device 10 may have a planar shape similar to a quadrangle having short sides in the first direction DR1 and long sides in the second direction DR2 as illustrated in FIG. 1. Each corner where a short side extending in the first direction DR1 meets a long side extending in the second direction DR2 may be rounded with a predetermined curvature or may be right-angled. The planar shape of the display device 10 is not limited to the quadrangular shape but may also be similar to other polygonal shapes, a circular shape, or an oval shape. However, the inventive concepts are not limited thereto, and the first direction DR1 and the second direction DR2 may also be long sides and short sides of the display device 10, respectively.

The display device 10 may be formed flat. Alternatively, the display device 10 may be formed such that two facing sides are bent. For example, the display device 10 may be formed such that left and right sides are bent. Alternatively, the display device 10 may be formed such that all of the upper, lower, left and right sides are bent.

The display device 10 according to the embodiment includes a cover window 100, a display panel 300, a display circuit board 310, a display driving circuit 320, a fingerprint sensor 400, a bracket 600, a main circuit board 700, and a bottom cover 900.

The cover window 100 may be disposed on the display panel 300 to cover a front surface of the display panel 300. Thus, the cover window 100 may function to protect an upper surface of the display panel 300.

The cover window 100 may include a light transmitting part DA100 corresponding to the display panel 300 and a light blocking part NDA100 corresponding to an area other than the display panel 300. The light blocking part NDA100 may be formed to be opaque. Alternatively, the light blocking part NDA100 may be formed as a decorative layer having a pattern that may be illustrated to a user when an image is not displayed.

The display panel 300 may be disposed under the cover window 100. The display panel 300 may be a light emitting display panel including light emitting elements. For example. the display panel 300 may be an organic light emitting display panel using organic light emitting diodes that include organic light emitting layers. However, the inventive concepts are not limited thereto, and the display panel 300 may also be an inorganic light emitting display panel including inorganic light emitting diodes.

The display panel 300 may include a main area MA and a sub area SBA.

The main area MA may include a display area DA configured to display an image and a non-display area NDA located around the display area DA. The display area DA may include display pixels SP (see FIG. 3) that display an image. The non-display area NDA may be defined as an area extending from the outside of the display area DA to edges of the display panel 300.

The display area DA may include a fingerprint sensing area. The fingerprint sensing area indicates an area where the fingerprint sensor 400 is disposed. The fingerprint sensing area may be a part of the display area DA as illustrated in FIG. 2. The fingerprint sensor 400 may include, for example, an optical fingerprint sensor, an ultrasonic fingerprint sensor, or a capacitive fingerprint sensor. A case where an ultrasonic fingerprint sensor is applied as the fingerprint sensor 400 will be described below.

The main area MA of the display panel 300 may have a rectangular planar shape. For example, the main area MA may have a rectangular planar shape with right-angled corners. However, the inventive concepts are not limited thereto, and the main area MA may also have a rectangular planar shape with rounded corners.

The sub area SBA may protrude from a side of the main area MA in the second direction DR2. A length of the sub area SBA in the first direction DR1 may be smaller than a length of the main area MA in the first direction DR1, and a length of the sub area SBA in the second direction DR2 may be smaller than a length of the main area MA in the second direction DR2, but the inventive concepts are not limited thereto.

Although the sub area SBA is unfolded in FIG. 2, it may also be bent, in which case the sub area SBA may be disposed on a lower surface of the display panel 300. When the sub area SBA is bent, it may be overlapped by the main area MA in the thickness direction DR3. The display circuit board 310 and the display driving circuit 320 may be disposed in the sub area SBA.

The display circuit board 310 may be attached to an end of the sub area SBA of the display panel 300 using a conductive adhesive member such as an anisotropic conductive film. Therefore, the display circuit board 310 may be electrically connected to the display panel 300 and the display driving circuit 320. The display panel 300 and the display driving circuit 320 may receive digital video data, timing signals, and driving voltages through the display circuit board 310. The display circuit board 310 may be a flexible printed circuit board, a printed circuit board, or a flexible film such as a chip-on-film.

The display driving circuit 320 may generate signals and voltages configured to drive the display panel 300. The display driving circuit 320 may be formed as an integrated circuit and attached onto the sub area. SBA of the display panel 300 using a chip-on-glass (COG) method, a chip-on-plastic (COP) method, or an ultrasonic bonding method. However, the inventive concepts are not limited thereto. For example, the display driving circuit 320 may also be attached onto the display circuit board 310 using a chip-on-film (COF) method.

A touch driving circuit 330 may be disposed on the display circuit board 310. The touch driving circuit 330 may be formed as an integrated circuit and attached to an upper surface of the display circuit board 310.

In addition, a power supply unit configured to supply display driving voltages configured to drive the display driving circuit 320 may be additionally disposed on the display circuit board 310.

The fingerprint sensor 400 may be disposed on the lower surface of the display panel 300. The fingerprint sensor 400 may be attached to the lower surface of the display panel 300 using a fifth bonding member to be described later.

The bracket 600 may be disposed under the display panel 300. The bracket 600 may include plastic, metal, or both plastic and metal. The bracket 600 may include a first camera hole CMH1 into which a first camera sensor 720 is inserted, a battery hole BH in which a battery is disposed, and a cable hole CAH through which a cable 314 connected to the display circuit board 310 passes.

The main circuit board 700 and a battery 790 may be disposed under the bracket 600. The main circuit board 700 may be a printed circuit board or a flexible printed circuit board.

The main circuit board 700 may include a main processor 710, the first camera sensor 720, and a main connector 730. The first camera sensor 720 may be disposed on both upper and lower surfaces of the main circuit board 700, the main processor 710 may be disposed on the upper surface of the main circuit board 700, and the main connector 730 may be disposed on the lower surface of the main circuit board 700.

The main processor 710 may control all functions of the display device 10. For example, the main processor 710 may output digital video data to the display driving circuit 320 through the display circuit board 310 so that the display panel 300 can display an image. In addition, the main processor 710 may receive touch data from the touch driving circuit 330, determine touch coordinates of a user, and then execute an application indicated by an icon displayed at the touch coordinates of the user. In addition, the main processor 710 may convert first image data received from the first camera sensor 720 into digital video data and output the digital video data to the display driving circuit 320 through the display circuit board 310. Thus, an image captured by the first camera sensor 720 may be displayed on the display panel 300.

The first camera sensor 720 processes an image frame such as a still image or a moving image obtained by an image sensor and outputs the processed image frame to the main processor 710. The first camera sensor 720 may be a complementary metal-oxide-semiconductor (CMOS) image sensor or a charge-coupled device (CCD) sensor. The first camera sensor 720 may be exposed on a lower surface of the bottom cover 900 by a second camera hole CMH2. Thus, the first camera sensor 720 can photograph an object or background disposed under the display device 10.

The cable 314 passing through the cable hole CAH of the bracket 600 may be connected to the main connector 730. Therefore, the main circuit board 700 may be electrically connected to the display circuit board 310.

The battery 790 may be disposed not to overlap the main circuit board 700 in the third direction DR3. The battery 790 may overlap the battery hole BH of the bracket 600. In addition, the fingerprint sensor 400 may overlap the battery hole BH of the bracket 600.

In addition, the main circuit board 700 may further include a mobile communication module capable of transmitting and receiving wireless signals to and from at least one of a base station, an external terminal, and a server over a mobile communication network. The wireless signals may include voice signals, video call signals, or various types of data according to transmission/reception of text/multimedia messages.

The bottom cover 900 may be disposed under the main circuit board 700 and the battery 790. The bottom cover 900 may be fastened and fixed to the bracket 600. The bottom cover 900 may form the bottom exterior of the display device 10. The bottom cover 900 may include plastic, metal, or both plastic and metal.

The second camera hole CMH2 exposing a lower surface of the first camera sensor 720 may be formed in the bottom cover 900. The position of the first camera sensor 720 and the positions of the first and second camera holes CMH1 and CMH2 corresponding to the first camera sensor 720 are not limited to the embodiment illustrated in FIG. 2.

Figure 3:
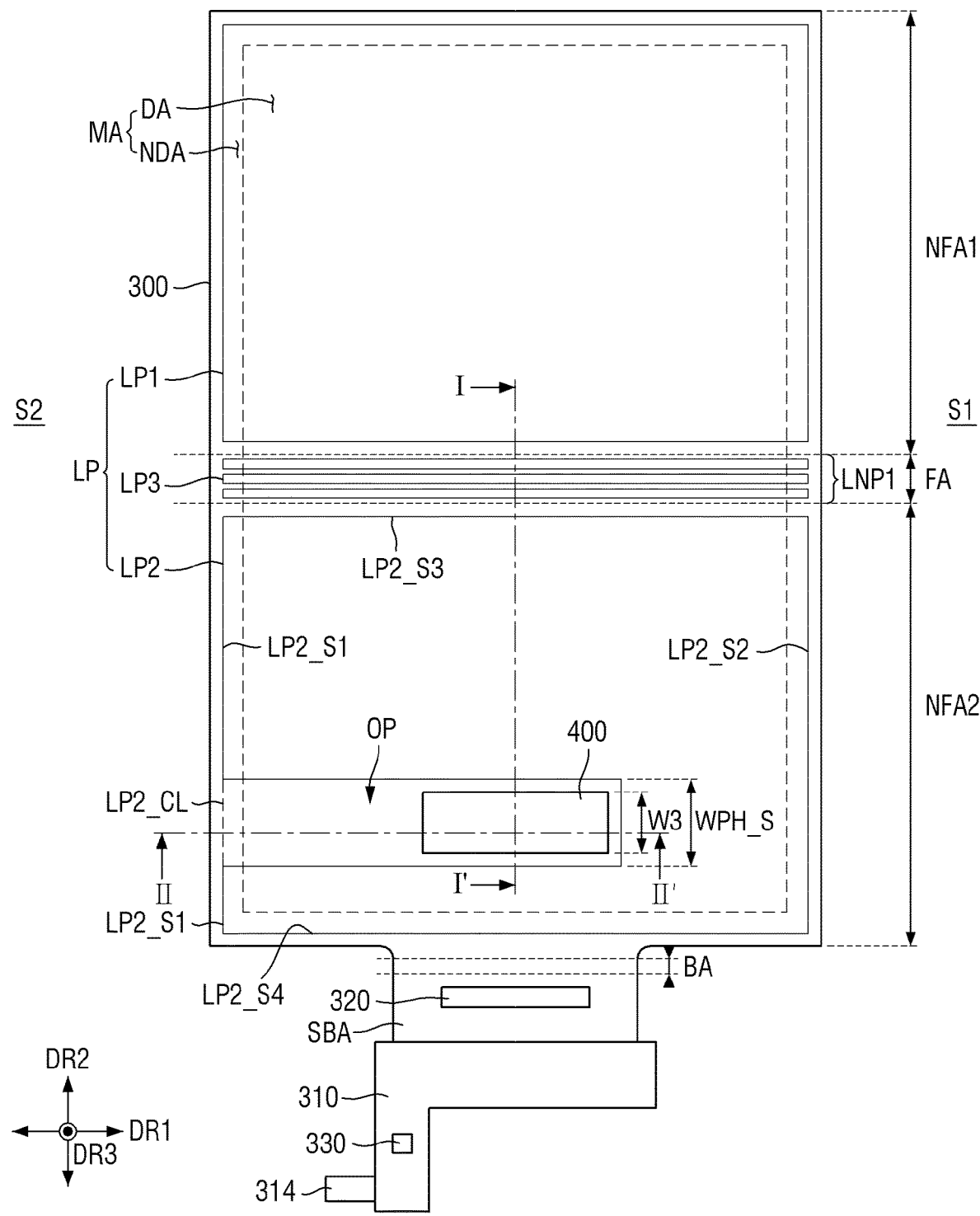
FIG. 3 is a plan view illustrating a display panel, a metal plate, a display circuit board, and a display driving circuit of the display device according to the embodiment of FIG. 2.
Figure 4:
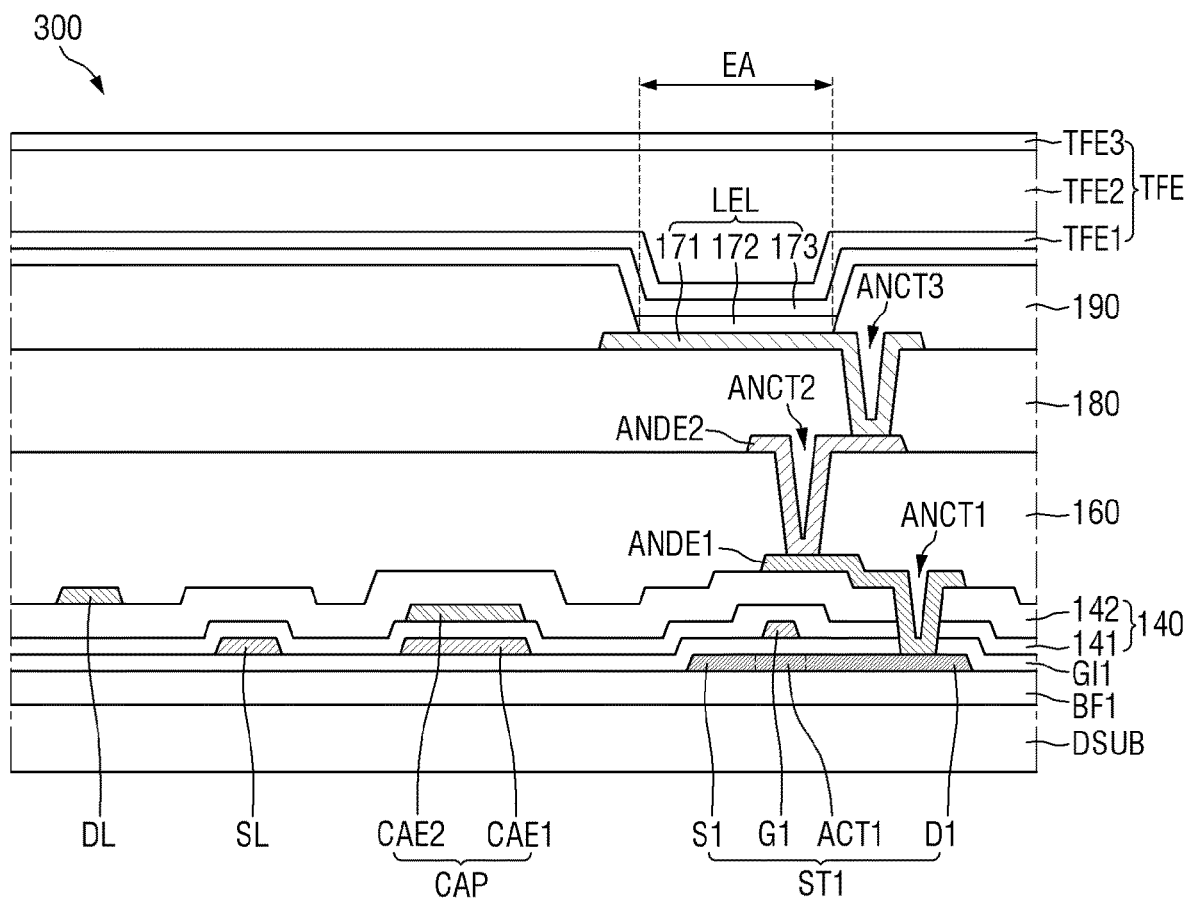
FIG. 4 is an exemplary cross-sectional view of the display panel of FIG. 3.
Figure 5:
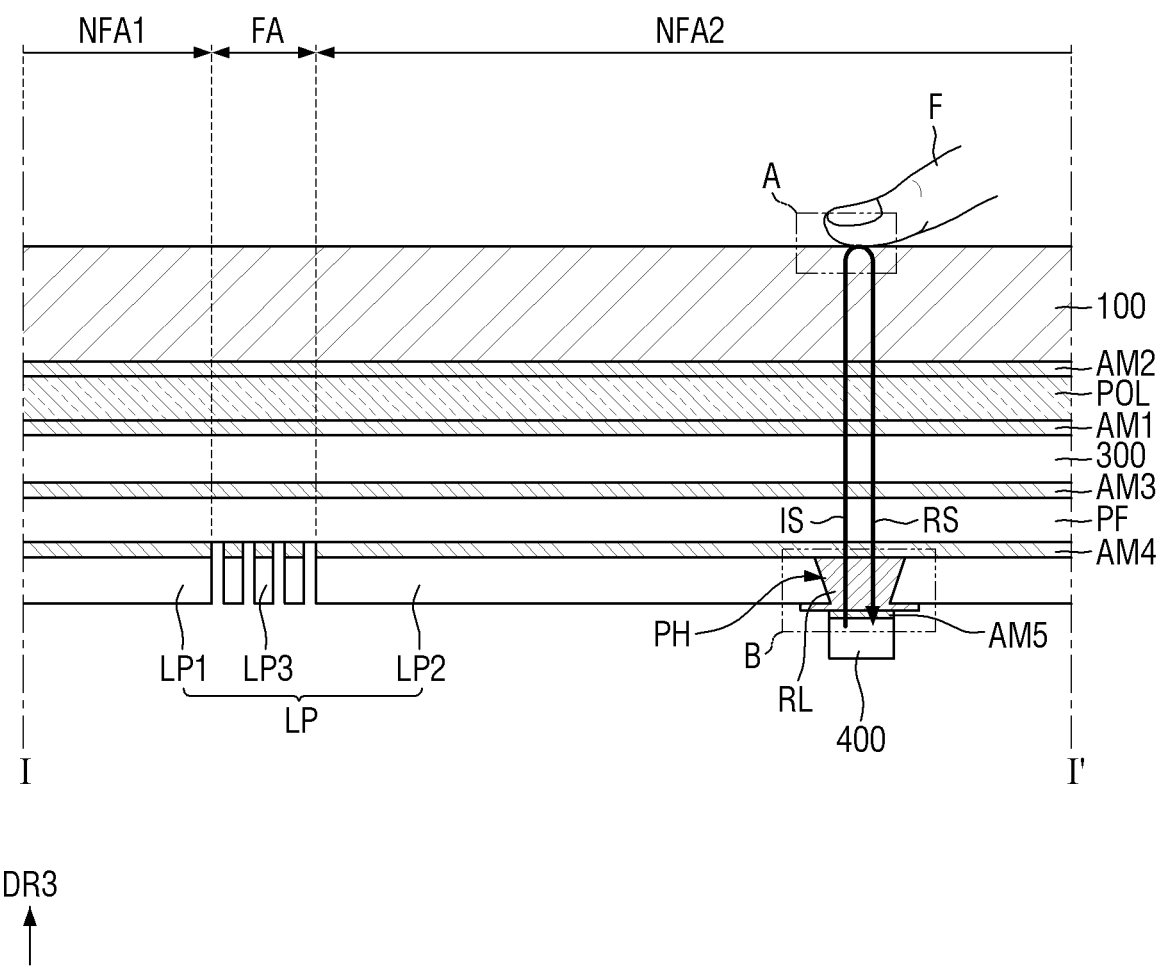
FIG. 5 is a cross-sectional view taken along line I-I' of FIG. 3.

FIG. 3 is a plan view illustrating the display panel 300, a metal plate LP, the display circuit board 310, and the display driving circuit 320 of the display device 10 according to the embodiment of FIG. 2. FIG. 4 is an exemplary cross-sectional view of the display panel 300 of FIG. 3. FIG. 5 is a cross-sectional view taken along line I-I' of FIG. 3. FIG. 5 illustrates a case where a user touches an upper surface of the cover window 100 with a finger F for fingerprint recognition.

Referring to FIGS. 3 through 5, a folding area FA and non-folding areas NFA1 and NFA2 may be further defined in the display device 10. The folding area FA may have a linear shape extending along the first direction DR1. A first non-folding area NFA1 may be adjacent the folding area. FA in the second direction DR2, and a second non-folding area NFA2 may be adjacent the folding area FA in the second direction DR2 opposite the first non-folding area NFA1. The area of each of the non-folding areas NFA1 and NFA2 may be, but not necessarily, larger than the area of the folding area FA.

The display device 10 may be a foldable display device that can be folded or unfolded about the folding area FA while the non-folding areas NFA1 and NFA2 remain unfolded. The display device 10 may be an in-foldable display device that is in-folded about the folding area FA so that an upper surface of the first non-folding area NFA1 of the display device 10 and an upper surface of the second non-folding area NFA2 of the display device 10 face each other or may be an out-foldable display device that is out-folded about the folding area FA so that a lower surface of the first non-folding area NFA1 of the display device 10 and a lower surface of the second non-folding area NFA2 of the display device 10 face each other.

The fingerprint sensor 400 may be disposed in the second non-folding area NFA2 as illustrated in FIG. 3. However, the inventive concepts are not limited thereto, and the fingerprint sensor 400 may also be disposed in the first non-folding area NFA1 or may be disposed in the folding area FA.

As illustrated in FIG. 4, the display panel 300 may include display pixels SP that display an image. Each of the display pixels SP may include a light emitting element LEL, a first thin-film transistor ST1, and a capacitor CAP.

A display substrate DSUB may be made of an insulating material such as glass or polymer resin. For example, the display substrate DSUB may include polyimide. The display substrate DSUB may be a flexible substrate that can be bent, folded, rolled, and the like.

The display substrate DSUB may include, for example, a plurality of organic layers and a plurality of inorganic layers. For example, the display substrate DSUB may include a first organic layer, a first barrier layer disposed on the first organic layer and including at least one inorganic layer, a second organic layer disposed on the first barrier layer, and a second barrier layer disposed on the second organic layer and including at least one inorganic layer.

A first buffer layer BF1 may be disposed on the display substrate DSUB. The first buffer layer BF1 is a layer configured to protect a thin-film transistor of a thin-film transistor layer TFTL and a light emitting layer 172 of a light emitting element layer EML from moisture introduced through the display substrate DSUB which is vulnerable to moisture permeation. The first buffer layer BF1 may be composed of a plurality of inorganic layers stacked alternately. For example, the first buffer layer BF1 may be a multilayer in which one or more inorganic layers selected from a silicon nitride layer, a silicon oxynitride layer, a silicon oxide layer, a titanium oxide layer, and an aluminum oxide layer are alternately stacked.

A first active layer ACT1, a first source electrode S1, and a first drain electrode D1 of the first thin-film transistor ST1 may be disposed on the first buffer layer BF1. The first active layer ACT1 of the first thin-film transistor ST1 includes polycrystalline silicon, monocrystalline silicon, low-temperature polycrystalline silicon, amorphous silicon, or an oxide semiconductor. The first source electrode S1 and the first drain electrode D1 may be formed to have conductivity by doping a silicon semiconductor or an oxide semiconductor with ions or impurities. The first active layer ACT1 may be overlapped by a first gate electrode G1 in the third direction DR3 which is the thickness direction of the display substrate DSUB, and the first source electrode S1 and the first drain electrode D1 may not be overlapped by the first gate electrode G1 in the third direction DR3.

A first gate insulating layer GI1 may be disposed on the first active layer ACT1 of the first thin-film transistor ST1. The first gate insulating layer GI1 may be made of an inorganic layer such as a silicon nitride layer, a silicon oxynitride layer, a silicon oxide layer, a titanium oxide layer, or an aluminum oxide layer.

The first gate electrode G1 of the first thin-film transistor ST1, a first capacitor electrode CAE1, and a scan line SL may be disposed on the first gate insulating layer GI1. The first gate electrode G1 may overlap the first active layer ACT1 in the third direction DR3. The scan line SL may be electrically connected to the first gate electrode G1. The first capacitor electrode CAE1 may be overlapped by a second capacitor electrode CAE2 in the third direction DR3. Each of the first gate electrode G1 and the scan line SL may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A first interlayer insulating film 141 may be disposed on the first gate electrode G1 and the first capacitor electrode CAE1. The first interlayer insulating film 141 may be made of an inorganic layer such as a silicon nitride layer, a silicon oxynitride layer, a silicon oxide layer, a titanium oxide layer, or an aluminum oxide layer.

The second capacitor electrode CAE2 may be disposed on the first interlayer insulating film 141. Because the first interlayer insulating film 141 has a predetermined dielectric constant, the first capacitor electrode CAE1, the second capacitor electrode CAE2, and the first interlayer insulating film 141 disposed between the first capacitor electrode CAE1 and the second capacitor electrode CAE2 may form the capacitor CAP. The second capacitor electrode CAE2 may be a single layer or a multilayer made of any one or more of molybdenum (Mo), aluminum (Al), chromium (Cr), gold (Au), titanium (Ti), nickel (Ni), neodymium (Ne), copper (Cu), and alloys of the same.

A second interlayer insulating film 142 may be disposed on the second capacitor electrode CAE2. The second interlayer insulating film 142 may be made of an inorganic layer such as a silicon nitride layer, a silicon oxynitride layer, a silicon oxide layer, a titanium oxide layer, or an aluminum oxide layer. The second interlayer insulating film 142 may include a plurality of inorganic layers.

A first pixel connection electrode ANDE1 and a data line DL may be disposed on the second interlayer insulating film 142. The first pixel connection electrode ANDE1 may be connected to the first drain electrode D1 of the first thin-film transistor ST1 through a first pixel contact hole ANCT1 penetrating the first interlayer insulating film 141 and the second interlayer insulating film 142 to expose the first drain electrode D1 of the first thin-film transistor ST1. The first pixel connection electrode ANDE1 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A first organic layer 160 for planarization may be disposed on the first pixel connection electrode ANDE1. The first organic layer 160 may be made of acryl resin, epoxy resin, phenolic resin, polyamide resin, polyimide resin, or the like.

A second pixel connection electrode ANDE2 may be disposed on the first organic layer 160. The second pixel connection electrode ANDE2 may be connected to the first pixel connection electrode ANDE1 through a second pixel contact hole ANCT2 penetrating the first organic layer 160 to expose the first pixel connection electrode ANDE1. The second pixel connection electrode ANDE2 may be a single layer or a multilayer made of any one or more of molybdenum (Mo), aluminum (Al), chromium (Cr), gold (Au), titanium (Ti), nickel (Ni), neodymium (Nd), copper (Cu), and alloys of the same.

A second organic layer 180 may be disposed on the second pixel connection electrode ANDE2. The second organic layer 180 may be made of acryl resin, epoxy resin, phenolic resin, polyamide resin, polyimide resin, or the like.

In an embodiment, the second pixel connection electrode ANDE2 and the second organic layer 180 may be omitted. In this case, the first pixel connection electrode ANDE1 may be directly connected to a light-emitting pixel electrode 171.

In FIG. 4, the first thin-film transistor ST1 is formed as a top-gate type in which the first gate electrode G1 is located above the first active layer ACT1. However, it should be noted that the inventive concepts are not limited thereto. The first thin-film transistor ST1 may also be formed as a bottom-gate type in which the first gate electrode G1 is located under the first active layer ACT1 or a double-gate type in which the first gate electrode G1 is located both above and under the first active layer ACT1.

100991 The light emitting elements LEL and a bank 190 may be disposed on the second organic layer 180. Each of the light emitting elements LEL includes the light-emitting pixel electrode 171, the light emitting layer 172, and a light-emitting common electrode 173.

The light-emitting pixel electrode 171 may be formed on the second organic layer 180. The light-emitting pixel electrode 171 may be connected to the second pixel connection electrode ANDE2 through a third pixel contact hole ANCT3 penetrating the second organic layer 180 to expose the second pixel connection electrode ANDE2.

In a top emission structure in which light is emitted from the light emitting layer 172 toward the light-emitting common electrode 173, the light-emitting pixel electrode 171 may be made of a metal material having high reflectivity, such as a stacked structure (Ti/Al/Ti) of aluminum and titanium, a stacked structure (ITO/Al/ITO) of aluminum and indium tin oxide, an APC alloy, or a stacked structure (ITO/APC/ITO) of an APC alloy and indium tin oxide. The APC alloy is an alloy of silver (Ag), palladium (Pd), and copper (Cu).

The bank 190 may be formed on the second organic layer 180 to separate the light-emitting pixel electrode 171 from another light-emitting pixel electrode 171 so as to define an emission area EA. The bank 190 may cover edges of the light-emitting pixel electrode 171. The bank 190 may be made of an organic layer such as acryl resin, epoxy resin, phenolic resin, polyamide resin, or polyimide resin.

The emission area EA is an area in which the light-emitting pixel electrode 171, the light emitting layer 172, and the light-emitting common electrode 173 are sequentially stacked so that holes from the light-emitting pixel electrode 171 and electrons from the light-emitting common electrode 173 combine together in the light emitting layer 172 to emit light.

The light emitting layer 172 is formed on the light-emitting pixel electrode 171 and the bank 190. The light emitting layer 172 may include an organic material to emit light of a predetermined color. For example, the light emitting layer 172 may include a hole transporting layer, an organic material layer, and an electron transporting layer. Although the light emitting layer 172 is located within the emission area EA in FIG. 4, the inventive concepts are not limited thereto, and the light emitting layer 172 may also extend onto the bank 190. Further, at least one of the elements of the light emitting layer 172 may have a different pattern from other elements. For example, the organic material layer and the hole transporting layer/the electron transporting layer may have different patterns.

The light-emitting common electrode 173 is formed on the light emitting layer 172. The light-emitting common electrode 173 may cover the light emitting layer 172. The light-emitting common electrode 173 may be a common layer common to all emission areas EA. A capping layer (not illustrated) may be formed on the light-emitting common electrode 173.

In the top emission structure, the light-emitting common electrode 173 may be made of a transparent conductive oxide (SCE) capable of transmitting light, such as indium tin oxide (ITO) or indium zinc oxide (IZO), or a semi-transmissive conductive material such as magnesium (Mg), silver (Ag) or an alloy of Mg and Ag.

An encapsulation layer TFE may be disposed on the light-emitting common electrode 173. The encapsulation layer TFE includes at least one inorganic layer to prevent oxygen or moisture from permeating into the light emitting element layer EML. In addition, the encapsulation layer TFE includes at least one organic layer to protect the light emitting element layer EML from foreign substances such as dust. For example, the encapsulation layer TFE includes a first encapsulating inorganic layer TFE1, an encapsulating organic layer TFE2, and a second encapsulating inorganic layer TFE3.

In the embodiment, the display panel 300 is described as an organic light emitting display panel using organic light emitting diodes. However, the inventive concepts are not limited thereto, and the display panel 300 may also be a micro light emitting diode display panel using micro light emitting diodes, a quantum dot light emitting display panel using quantum dot light emitting diodes that include quantum dot light emitting layers, or an inorganic light emitting display panel using inorganic light emitting elements that include inorganic semiconductors.

As illustrated in FIG. 5, the display device 10 may include a polarizing layer POL, the cover window 100, the metal plate LP, a filling member RL, and bonding members AM1 through AM5 that bond adjacent members. Of the bonding members AM1 through AM5, first through fourth bonding members AM1 through AM4 may be pressure sensitive adhesives (PSAs), and a fifth bonding member AM5 may be a transparent adhesive resin such as an optically clear resin (OCR). However, the inventive concepts are not limited thereto. The first through fourth bonding members AM1 through AM4 may also be selected from an OCR and an optically clear adhesive (OCA), and the fifth bonding member AM5 may also be a PSA or an OCA or may be a colored adhesive resin.

The polarizing layer POL may be disposed on the display panel 300. The polarizing layer POL may be attached to the upper surface of the display panel 300 through the first bonding member AM1. The polarizing layer POL reduces reflection of external light incident through the cover window 100.

The cover window 100 may be disposed on an upper surface of the polarizing layer POL. The cover window 100 may be attached to the upper surface of the polarizing layer POL through the second bonding member AM2. In some embodiments, the polarizing layer POL may be omitted. In the embodiments in which the polarizing layer POL is omitted, color filters and a black matrix disposed between adjacent color filters may be disposed between the cover window 100 and the display panel 300.

A protective layer PF may be disposed on the lower surface of the display panel 300. The protective layer PF may include, but is not limited to, polyimide (PI) or polyethylene terephthalate (PET). The protective layer PF may be attached to the lower surface of the display panel 300 through the third bonding member AM3.

When the display panel 300 according to the embodiment is of a top emission display panel, light transmittance of the third bonding member AM3 may be, but not necessarily, lower than light transmittance of the first and second bonding members AM1 and AM2.

The metal plate LP may be disposed under the protective layer PF. The metal plate LP may be attached to a lower surface of the protective layer PF through the fourth bonding member AM4. As illustrated in FIG. 3, the metal plate LP may include a first metal plate LP1 disposed in the first non-folding area NFA1, a second metal plate LP2 disposed in the second non-folding area NFA2, and a third metal plate LP3 composed of a plurality of first line patterns LNP1 disposed in the folding area FA. The first line patterns LNP1 may extend along the first direction DR1, and adjacent first line patterns LNP1 may be spaced apart from each other along the second direction DR2. The first and second metal plates LP1 and LP2 serve to support the display panels 300 thereon in the non-folding areas NFA1 and NFA2, respectively. Each of the first and second metal plates LP1 and LP2 may have a whole pattern shape that respectively encompass almost a whole portion of the non-folding areas NFA1 and NFA2. The metal plate LP may be made of a metal or a metal alloy. For example, the metal plate LP may be made of, but is not limited to, an aluminum alloy (SUS). In some embodiments, the third metal plate LP3 may be omitted. Although the first through third metal plates LP1 through LP3 are spaced apart from each other in the drawing, the inventive concepts are not limited thereto, and the first through third metal plates LP1 through LP3 may also be integrally formed and coupled to each other. The first through third metal plates LP1 through LP3 may be at least partially connected to form a single piece. In addition, although the first line patterns LNP1 of the third metal plate LP3 are not connected to each other in FIG. 3, the inventive concepts are not limited thereto, and the first line patterns LNP1 may also be connected to each other.

An open part OP may be further defined in the second metal plate LP2 at least partially surrounded by materials that form the second metal plate LP2. The open part OP may be surrounded by the materials that form the second metal plate LP2 in plan view. The open part OP may completely penetrate the second metal plate LP2 from an upper surface to a lower surface of the second metal plate LP2 in the thickness DR3 direction.

In plan view, the second metal plate LP2 includes a plurality of outlines extending in different directions (the first direction DR1 and the second direction DR2). One outline of the second metal plate LP2 includes a plurality of sides LP2_S1 extending along the second direction DR2 and a discontinuous part LP2_CL disposed between the sides LP2_S1. The the open part OP is recessed from the discontinuous part LP2_CL in the first direction DR1 and is formed in the second metal plate LP2. The filling member RL may be disposed in the open part OP. The filling member RL may be at least partially surrounded by the second metal plate LP2 in plan view. The filling member RL may be bonded to the lower surface of the protective layer PF through the fourth bonding member AM4 and may be bonded to the fingerprint sensor 400 through the fifth bonding member AM5.

The fourth bonding member AM4 may be a member-protective layer bonding member that bonds the filling member RL to the protective layer PF. The fourth bonding member AM4 may bond an upper surface of the filling member RL and the upper surface of the second metal plate LP2 to the lower surface of the protective layer PF.

However, the inventive concepts are not limited thereto, and a separate element may also be added between the protective layer PF and the second metal plate LP2.

The fifth bonding member AM5 may also be referred to as a member-sensor bonding member. The fingerprint sensor 400 may be overlapped by the filling member RL in the thickness direction DR3. The fingerprint sensor 400 may be bonded to a lower surface of the filling member RL and the lower surface of the second metal plate LP2 through the fifth bonding member AM5.

The metal plate LP may generally have a rectangular shape as illustrated in FIG. 3. That is, the first metal plate LP1, the second metal plate LP2, and the third metal plate LP3 of the metal plate LP may form the substantially rectangular shape. Here, the substantially rectangular shape may include a short side of the first metal plate LP1 on a first side in the second direction DR2 that forms a short side of the metal plate LP on a first side S1 in the second direction DR2. A short side of the second metal plate LP2 disposed on a second side S2 in the second direction DR2 forms a short side of the metal plate LP on the second side in the second direction DR2.

A long side of the metal plate LP on the first side may be referenced as a virtual line connecting a short side of the first metal plate LP1 on the first side S1 in the second direction DR2, a short side of the second metal plate LP2 on the first side S1 in the second direction DR2 and a short side of the third metal plate LP3 on the first side S1 in the second direction. Similarly a virtual line connecting a short side of the first metal plate LP1 on a second side S2 in the second direction DR2, a short side of the second metal plate LP2 on the second side S2 in the second direction DR2 and a short side of the third metal plate LP3 on the second side S2 in the second direction DR2 generally forms a long side of the metal plate LP on the second side in the second direction DR2.

The metal plate LP may include metal. The metal plate LP may be made of widely known metals that can be used as a metal plate in the art. For example, the metal plate LP may include copper (Cu) or aluminum (Al).

The open part OP may be formed by opening a part of at least one side of the metal plate LP. That is, the metal plate LP may include the open part OP formed by opening a part of at least one side of the metal plate LP.

The second metal plate LP2 may include a short side LP2_S2 located on the first side S1 in the second direction DR2, a short side LP2_S1 located on the second side S2 in the second direction DR2, a long side LP2_S3 located in the first direction DR1, and a long side LP2_S4 located in the first direction DR1 as illustrated in FIG. 3.

In an embodiment, the open part OP may be an open part of the long side of the metal plate LP on the second side S2 extending in the first direction DR1 from the discontinuous part LPS_CL and, further, may be an open part of the short side LP2_S1 of the second metal plate LP2 on the second side S2 in the first direction DR1.

The fingerprint sensor 400 may be located in the open part OP in plan view, and the filling member RL overlapping the fingerprint sensor 400 in the thickness direction may also be located in the open part OP in plan view. A width W3 of the fingerprint sensor 400 in the second direction DR2 may be smaller than a width WPH_S of the open part OP in the second direction DR2. In plan view, the open part OP may include a an opening located on the second side S2 in the second direction DR2, a short side extending in the second direction DR2, a long side extending in the first direction DR1, and another long side extending in the first direction DR1. The filling member RL may be surrounded by the long sides of the open part OP extending in the first direction DR1 and a short side extending in the second direction DR2, and may be exposed on the short opening of the open part OP located on the second side S2.

When the filling member RL expands at a high temperature, the open part OP may function to secure an area for the expansion of the filling member RL.

As illustrated in FIG. 5, a finger F may include a fingerprint having a surface facing the cover window 100. The fingerprint of the finger F may include concave parts and convex parts on the surface. The concave parts and the convex parts of the fingerprint may be repeatedly disposed. Based on at least one section including one concave part and one convex part among the repeated concave and convex parts, the convex part may be referred to as a ridge RID, and the concave part may be referred to as a valley VAL. The ridge RID of the fingerprint may be located closer to the cover window 100 than the valley VAL of the fingerprint. A method of operating an ultrasonic fingerprint sensor will be described with further reference to FIG. 6.

In some embodiments, separate layers may be further disposed between the metal plate LP and the protective layer PF. The layers include at least one functional layer. The functional layer may be a layer performing a heat dissipating function, an electromagnetic wave shielding function, a grounding function, a buffer function, a strength reinforcing function, a support function, and/or a digitizing function.

Figure 6:
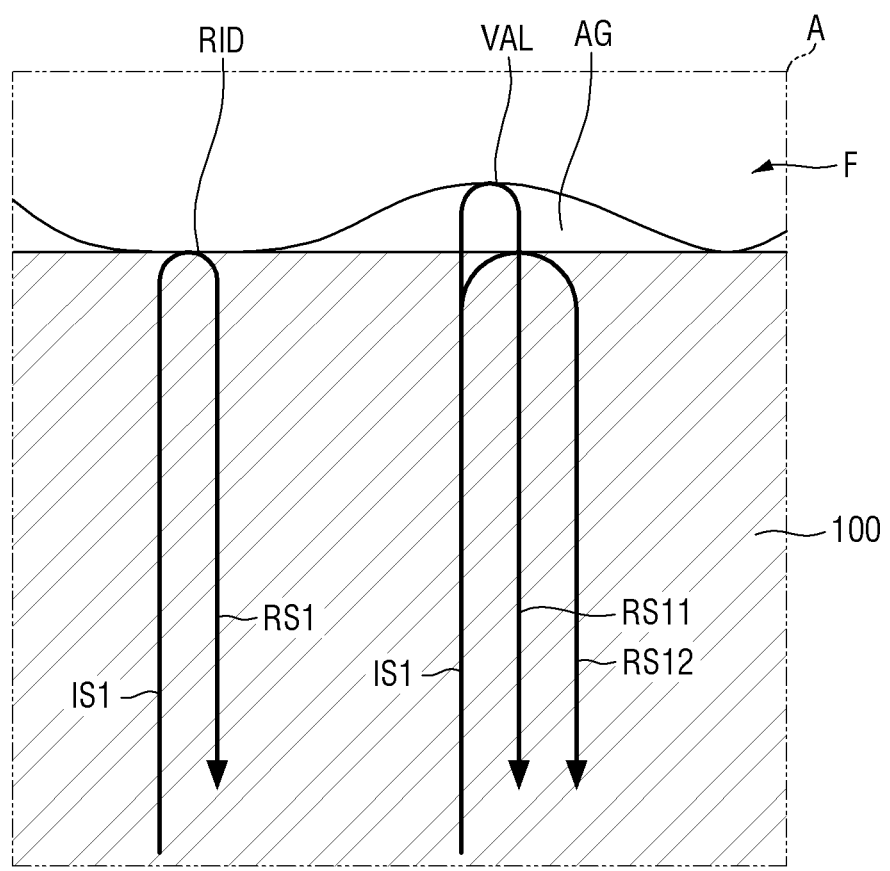
FIG. 6 is an enlarged cross-sectional view of area A of FIG. 5.

FIG. 6 is an enlarged cross-sectional view of area A of FIG. 5.

Referring to FIGS. 5 and 6, first ultrasonic waves IS1 are irradiated toward the ridge RID and the valley VAL of the fingerprint and then reflected from the ridge RID and the valley VAL. Although only a single ridge RID and valley VAL are illustrated, the drawing figure and description apply to multiple ridges RID and valleys VAL. A first ultrasonic wave IS1 irradiated toward the ridge RID may pass from the fingerprint sensor 400 through the fifth bonding member AM5, the filling member RL, the fourth bonding member AM4, the protective layer PF, the third bonding member AM3, the display panel 300, the first bonding member AM1, the polarizing layer POL, the second bonding member AM2 and the cover window 100 to reach the ridge RID. As illustrated in FIG. 6, because the ridge RID directly contacts the cover window 100, a gap, for example, an air gap AG may not exist between the ridge RID and the cover window 100. On the other hand, a first ultrasonic wave IS1 irradiated toward the valley VAL may pass from the fingerprint sensor 400 through the fifth bonding member AM5, the filling member RL, the fourth bonding member AM4, the protective layer PF, the third bonding member AM3, the display panel 300, the first bonding member AM1, the polarizing layer POL, the second bonding member AM2, the cover window 100 and the air gap AG to reach the valley VAL. The first ultrasonic wave IS1 may include a plurality of waves.

The first ultrasonic wave IS1 irradiated toward the valley VAL may further pass through the air gap AG compared with the first ultrasonic wave IS1 irradiated toward the ridge RID. Among the first ultrasonic waves IS1 generated from the ultrasonic fingerprint sensor 400, the first ultrasonic wave IS1 irradiated toward the ridge RID may be converted into a first signal RS1 reflected from the ridge RID, and the first ultrasonic wave IS1 irradiated toward the valley VAL may be converted into a second signal RS2 that includes a first reflected signal RS11 reflected at an interface between the air gap AG and the cover window 100 and a second reflected signal RS12 reflected from the valley VAL. The magnitude of the first reflected signal RS11 may be greater than the magnitude of the second reflected signal RS12.

The fingerprint sensor 400 may recognize the ridge RID and the valley VAL based on a first time difference between a generation time of the first ultrasonic waves IS1 and an arrival time of the first signal RS1 reflected from the ridge RID and a second time difference between the generation time of the first ultrasonic waves IS1 and an arrival time of the second signal RS2 reflected from the valley VAL and the interface between the air gap AG and the cover window 100. However, because the air gap AG is located between the valley VAL and the cover window 100, and ultrasonic waves generally have a different speed depending on the medium, and it may not be easy for a system to distinguish the ridge RID from the valley VAL based on the first time difference and the second time difference.

Therefore, in order to better distinguish the ridge RID from the valley VAL in consideration of the air gap AG between the valley VAL and the cover window 100, a method of distinguishing the ridge RID from the valley VAL by calculating a ratio between the intensity of a first ultrasonic wave IS1 to the intensity of a first signal RS1 and a second signal RS2 may be considered. The ratio between the intensity of the first ultrasonic wave IS1 and the intensity of the first signal RS1 is defined as a reflection coefficient R. Specifically, the reflection coefficient of the first ultrasonic wave IS1 generated toward the valley VAL may be greater than the reflection coefficient of the first ultrasonic wave IS1 generated toward the ridge RID. In other words, the ridge RID and the valley VAL may be distinguished based on the reflection coefficients of the first ultrasonic waves IS1.

Referring again to FIG. 5, when the metal plate LP including the second metal plate LP2 is disposed on a path of the first ultrasonic waves IS1 irradiated upward from the fingerprint sensor 400 and/or the first signals RS1 reflected from the fingerprint of the finger F, the signal intensity of each first ultrasonic wave IS1 and the signal intensity of each first signal RS1 may be reduced. In the display device 10 according to the embodiment, the open part OP formed by cutting (or penetrating) the metal plate LP is formed on the path of the first ultrasonic waves IS1 irradiated upward from the fingerprint sensor 400 and/or the first signals RS1 reflected from the fingerprint of the finger F.

Meanwhile, when the fingerprint sensor 400 is directly attached to the protective layer PF through the fourth bonding member AM4 in the open part OP, the display panel 300 overlapping the fingerprint sensor 400 in the thickness direction may be partially pressed upward by the attachment pressure, and the pressed part may be seen from the outside, thus causing a display defect. In order to prevent the formation of the pressed part, the fingerprint sensor 400 may be attached to the lower surface of the second metal plate LP2 adjacent to the open part OP with the open part OP interposed between them. In this case, however, the first ultrasonic waves IS irradiated from the fingerprint sensor 400 may be distorted by an air gap in the open part OP.

To prevent this, the open part OP may also be filled with a bonding member, and the lower surface of the protective layer PF and the fingerprint sensor 400 may be bonded together through the bonding member filling the open part OP. Even in this case, the protective layer PF and/or the display panel 300 may be pressed because the hardness of the bonding member is not sufficient.

In the display device 10 according to the embodiment, the open part OP may be filled with the filling member RL having a far greater hardness than the fifth bonding member AM5, and the fingerprint sensor 400 may be attached to the lower surface of the filling member RL through the fifth bonding member AM5. This method may prevent the protective layer PF and/or the display panel 300 from being pressed and prevent the open part OP from being seen. From the perspective of preventing a pressing defect, the hardness of the filling member RL may be about 10 times or more than the hardness of the fifth bonding member AM5. More preferably, the hardness of the filling member RL may be 20 or 30 times or more than the hardness of the fifth bonding member AM5. For example, the hardness of the filling member RL may be, but is not limited to, 0.8 Gps or more. According to an embodiment, the filling member RL is formed in the open part OP by an injection method. The filling member RL may be injected into the open part OP through the open short side LP2_S1 of the second metal plate LP2 on the first side in the first direction DR1, although the direction in which the filling member RL is injected into the open part OP is not limited thereto.

The hardness of the filling member RL may be smaller than the hardness of the adjacent second metal plate LP2.

Further, because the filling member RL is located on the path of the first ultrasonic waves IS irradiated from the fingerprint sensor 400, and the ultrasonic waves IS are generally set to a frequency band that passes well through the display panel 300, the filling member RL may have an impedance similar to that of the display panel 300 in order to increase the sensing efficiency of the fingerprint sensor 400. For example, the impedance of the filling member RL may be set within an error of about 5 MPa*m/s*10^−6 of the impedance of the display panel 300.

In some embodiments, when an ultrasonic fingerprint sensor is applied, the filling member RL may further include a black-based colorant. Because the filling member RL further includes a black-based colorant, it can prevent the fingerprint sensor 400 from being seen from the outside.

When an optical fingerprint sensor is applied as the fingerprint sensor 400, the filling member RL may have the same hardness and material as the filling member RL when an ultrasonic fingerprint sensor is applied. However, because the optical fingerprint sensor recognizes a fingerprint through light, the filling member RL may be designed in consideration of transmittance for the light. The filling member RL when the optical fingerprint sensor is applied may have a transmittance of about 90% or more for the light. The light may include visible light, ultraviolet light, or infrared light.

A coefficient of thermal expansion of the filling member RL and a coefficient of thermal expansion of the second metal plate LP2 adjacent to the filling member RL according to an embodiment may not be significantly different. When the filling member RL expands, it tends to expand in lateral, upward and downward directions. However, the filling member RL has difficulty expanding in the lateral direction because the rigid second metal plate LP2 is disposed, and the filling member RL has difficulty expanding in the upward direction because the bonding members AM4, AM3, AM1 and AM2, the protective layer PF, the display panel 300, the polarizing layer POL and the cover window 100 described above are disposed on the filling member RL. Therefore, the filling member RL expands in the downward direction in which it can expand more easily than in the upward and lateral directions. The downward expansion of the filling member RL may be accompanied by instability in the placement of the fingerprint sensor 400 required to accurately transmit and receive the ultrasonic waves IS and RS.

However, because the coefficient of thermal expansion of the filling member RL and the coefficient of thermal expansion of the metal plate LP (or the coefficient of thermal expansion of the second metal plate LP2) in the display device 10 according to the embodiment are not significantly different as described above, the instability in the placement of the fingerprint sensor 400 due to the downward expansion of the filling member RL can be prevented in advance.

The filling member RL may include a material that makes the coefficient of thermal expansion of the filling member RL not significantly different from the coefficient of thermal expansion of the metal plate LP. In an exemplary embodiment, the coefficient of thermal expansion of the filling member RL may have a value less than twice the coefficient of thermal expansion of the metal plate LP.

For example, the coefficient of thermal expansion of the metal plate LP may be about 17 ppm, and the coefficient of thermal expansion of the filling member RL may be about 30 ppm or less. The material of the filling member RL is not limited as long as it satisfies the above condition as well as the hardness condition of the filling member RL and the impedance condition of the filling member RL. For example, the filling member RL may include a liquid crystal plastic (LCP)-based polymer that satisfies the above conditions. In some embodiments, the filling member RL may be made of acrylonitrile butadiene styrene copolymer (ABS) or polycarbonate (PC).

In the display device 10 according to the embodiment, because the second metal plate LP2 includes the open part OP, it secures an area for thermal expansion of the filling member RL. In addition, because the filling member RL is made of a material that makes the coefficient of thermal expansion of the filling member RL have a value less than twice the coefficient of thermal expansion of the metal plate LP, instability in the placement of the fingerprint sensor 400 due to the thermal expansion of the filling member RL can be improved, thereby ensuring the reliability of the display device 10.

A cross-sectional shape of the filling member RL and the second metal plate LP2 will now be described.

Figure 7:
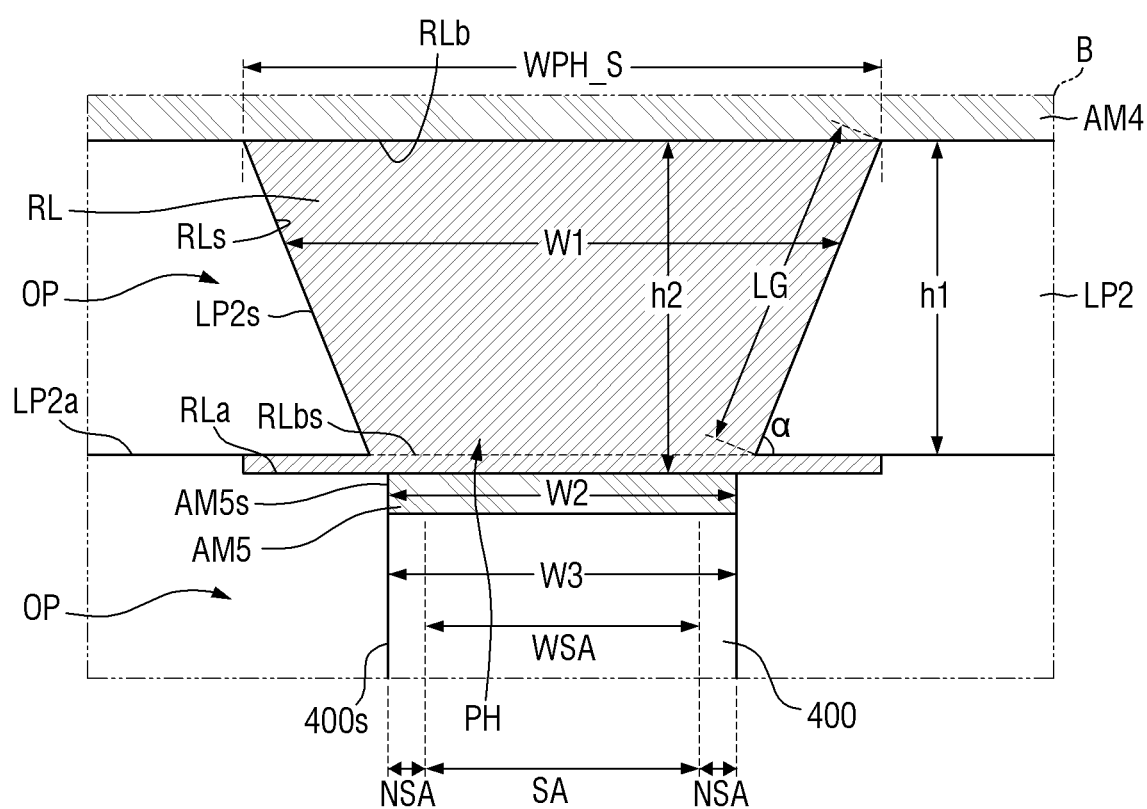
FIG. 7 is an enlarged cross-sectional view of area B of FIG. 5.
Figure 8:
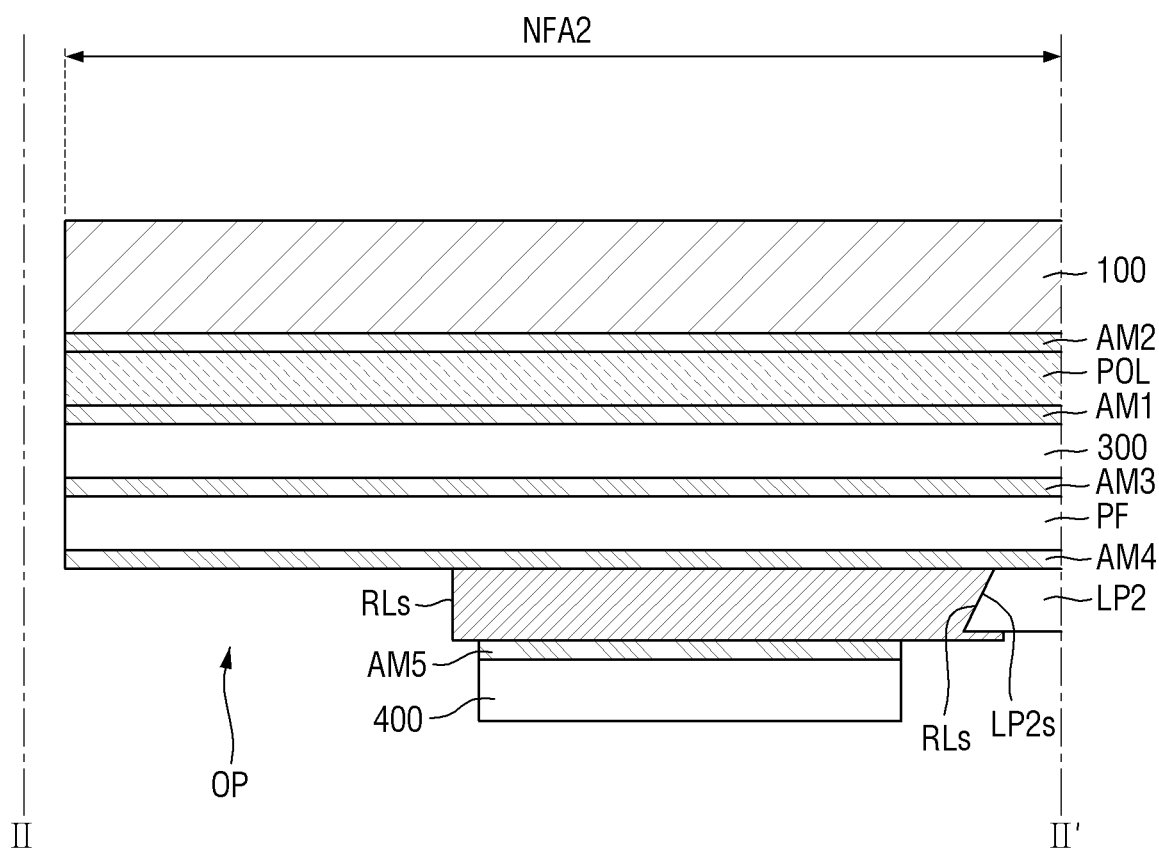
FIG. 8 is a cross-sectional view taken along line II-II' of FIG. 3.

FIG. 7 is an enlarged cross-sectional view of area B of FIG. 5. FIG. 8 is a cross-sectional view taken along line II-II' of FIG. 3.

Referring to FIGS. 5, 7 and 8, each side surface LP2s and a lower surface LP2a of the second metal plate LP2 may form a predetermined inclination angle α, and the inclination angle α may be about 40 to 50 degrees. If the inclination angle α is about 50 degrees or less, side surfaces RLs of the filling member RL may secure a sufficient length LG. Therefore, the adhesion between the filling member RL and the side surfaces LP2s of the second metal plate LP2 may increase, thus improving the problem of the filling member RL being removed from the open part OP. If the inclination angle α is about 40 degrees or more, it is possible to prevent the length LG of each side surface RLs of the filling member RL from becoming too long and thus relatively increasing the amount of the filling member RL. Therefore, it is possible to prevent structural reliability in the open part OP from being reduced by the filling member RL having a relatively lower hardness than the second metal plate LP2.

As illustrated in FIG. 7, an upper surface RLb of the filling member RL may directly contact the fourth bonding member AM4, and a lower surface RLa may directly contact the fifth bonding member AM5. The side surfaces RLs may directly contact the side surfaces LP2s of the second metal plate LP2. The lower surface RLa of the filling member RL may protrude further downward than the lower surface LP2a of the second metal plate LP2, and the filling member RL may partially cover the lower surface LP2a of the second metal plate LP2. That is, a width of the filling member RL protruding out of the open part OP (not illustrated) may be greater than the width W1 of the filling member RL located in the open part OP. W1 may represent a variable width of the filling member RL throughout different portions of the trapezoidal shape. A thickness h2 of the filling member RL may be greater than a thickness h1 of the adjacent second metal plate LP2. The width W1 of the filling member RL protruding further downward than the lower surface LP2a of the second metal plate LP2 may be greater than a maximum width of the open part OP.

The fifth bonding member AM5 may contact an upper surface of the fingerprint sensor 400 and the lower surface RLa of the filling member RL. The fifth bonding member AM5 may overlap the fingerprint sensor 400 in the thickness direction DR3 and may have a width W2 equal to a width W3 of the fingerprint sensor 400 or may have a width W2 greater than the width W3 of the fingerprint sensor 400 but smaller than a minimum width of the open part OP. When the fifth bonding member AM5 has the width W2 equal to the width W3 of the fingerprint sensor 400, side surfaces AM5s of the fifth bonding member AM5 may be aligned with side surfaces 400s of the fingerprint sensor 400 in the thickness direction.

However, the inventive concepts are not limited thereto. Unlike in the drawing, the fifth bonding member AM5 may also directly contact the entire lower surface RLa of the filling member RL, side surfaces of the filling member RL protruding further downward than the lower surface LP2a of the second metal plate LP2, and a part of the lower surface LP2a of the second metal plate LP2. That is, the side surfaces AM5s of the fifth bonding member AM5 may be located further out than the side surfaces of the filling member RL protruding further downward than the lower surface LP2a of the second metal plate LP2, and the width W2 of the fifth bonding member AM5 may be greater than the width W1 of the filling member RL. Because the fifth bonding member AM5 contacts the entire lower surface RLa of the filling member RL and further contacts a part of the lower surface LP2a of the second metal plate LP2 as in the embodiment, the second metal plate LP2 and the filling member RL may be indirectly bonded through the fifth bonding member AM5. This prevents the filling member RL from being removed from the open part OP, thereby improving the durability of the display device 10.

The fingerprint sensor 400 includes an active area SA in which sensors configured to transmit and receiving ultrasonic waves are disposed and a non-active area NSA in which the sensors configured to transmit and receiving ultrasonic waves are not disposed. A minimum width of the filling member RL may be greater than a width WSA of the active area SA. The width W3 of the fingerprint sensor 400 may be smaller than the width W2 of the fifth bonding member AM5. The width W1 of the filling member RL may be, but not necessarily, greater than the width W3 of the fingerprint sensor 400.

A structure in which the filling member RL partially covers and contacts the lower surface of the second metal plate LP2 as in the embodiment may be a structure unintentionally formed in the process of forming the filling member RL in the second metal plate LP2 having the open part OP, but the inventive concepts are not limited thereto.

A width of the open part OP of the second metal plate LP2 according to an embodiment may be reduced from top to bottom. A cross-sectional shape of the open part OP may be trapezoidal. The width W1 of the filling member RL having a cross-sectional shape similar to the cross-sectional shape of the open part OP may also be generally reduced from top to bottom in the open part OP.

An injection process of the filling member RL from the open part OP is performed by placing a mold on the open part OP and an upper surface of the second metal plate LP2 and injecting a filling member material into the open part OP. Generally, the greater the injection pressure, the higher the injection temperature and the longer the injection time, the greater the degree to which the filling member material fills the open part OP, and the smaller the injection pressure, the lower the injection temperature and the shorter the injection time, the smaller the degree to which the filling member material fills the open part OP.

As illustrated in FIG. 8, a side surface RLs of the filling member RL may contact a side surface LP2s of the second metal plate LP2, and the other side surface RLs of the filling member RL may be exposed. The other side surface RLs of the filling member RL may be exposed by the second metal plate LP2. Because the other side surface RLs of the filling member RL is exposed, when the filling member RL thermally expands in a high-temperature environment, the filling member RL may thermally expand toward the other side surface RLs of the filling member RL.

As illustrated in FIG. 8, the filling member RL may have a different shape with respect to the open part OP than that of FIG. 7. For example, a portion of the filling member RL adjacent the open part OP may be flat in the thickness direction DR3, whereas in FIG. 7 is was slanted. The lower surface RLa of the filling member RL may thus be only disposed on one side of the filling member RL opposite the open part OP.

Figure 9:
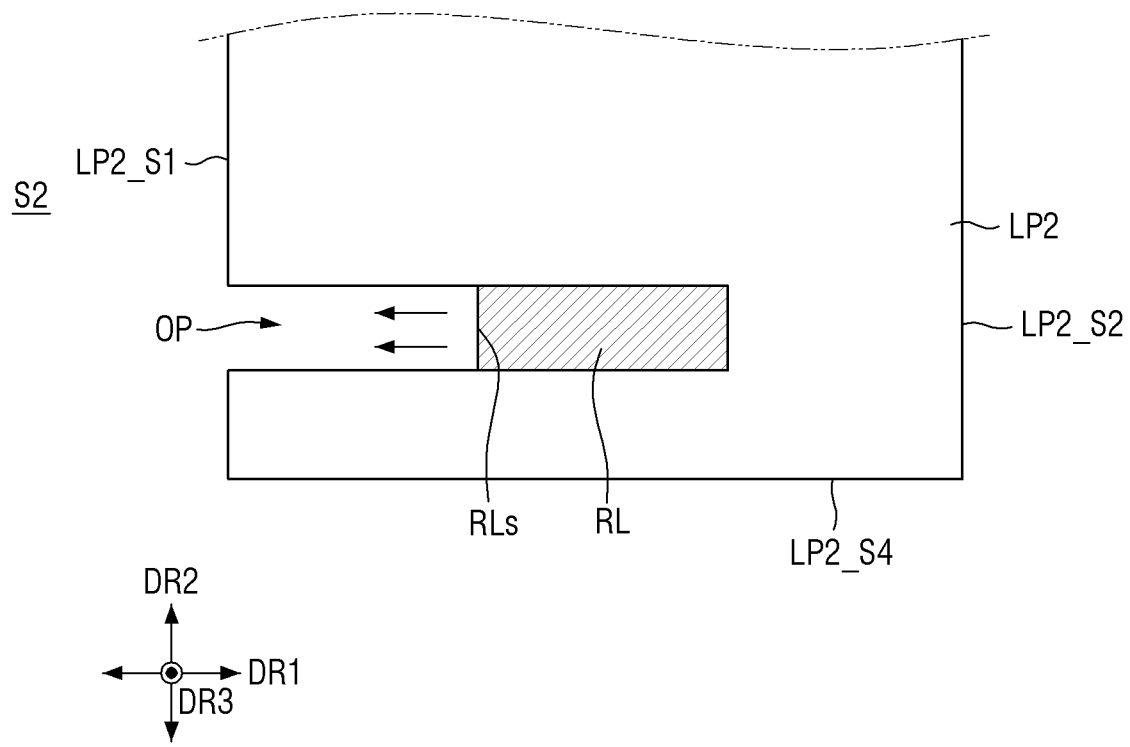
FIG. 9 is a mimetic diagram illustrating thermal expansion of a filling member in a high-temperature environment according to an embodiment.

FIG. 9 is a mimetic diagram illustrating thermal expansion of the filling member RL in a high-temperature environment according to an embodiment.

Referring to FIG. 9, as described above, the open part OP may be formed by opening the short side LP2_S1 of the second metal plate LP2 on the second side S2 to extend in the first direction DR1, and the filling member RL may be located in the open part OP to fill the open part OP. As described above, the filling member RL has a coefficient of thermal expansion not significantly different from the coefficient of thermal expansion of the second metal plate LP2. Even if the coefficient of thermal expansion of the filling member RL is minimized, the coefficient of thermal expansion of the filling member RL is basically greater than the coefficient of thermal expansion of the second metal plate LP2 in a high-temperature environment. Therefore, the filling member RL may thermally expand when exposed to the high-temperature environment. As illustrated in FIG. 9, when the filling member RL thermally expands, it is difficult for the filling member RL to expand on the long sides of the open part OP located on the first and second sides in the second direction DR2 and on a short side of the open part OP located towards the first side S1 in the first direction DR1, all of which contact the filling member RL. However, the filling member RL is exposed in a direction in which the other side surface RLs of the filling member RL faces. Therefore, it is possible to secure a sufficient area for thermal expansion of the filling member RL, thereby ensuring structural reliability of the display device 10.

Other embodiments will now be described. In the following embodiments, the same elements as those of the embodiment described above will be indicated by the same reference characters, and their description will be omitted or given briefly.

Display devices of FIGS. 10 through 12 to be described below illustrate that the position of an open part can be changed variously.

Figure 10:
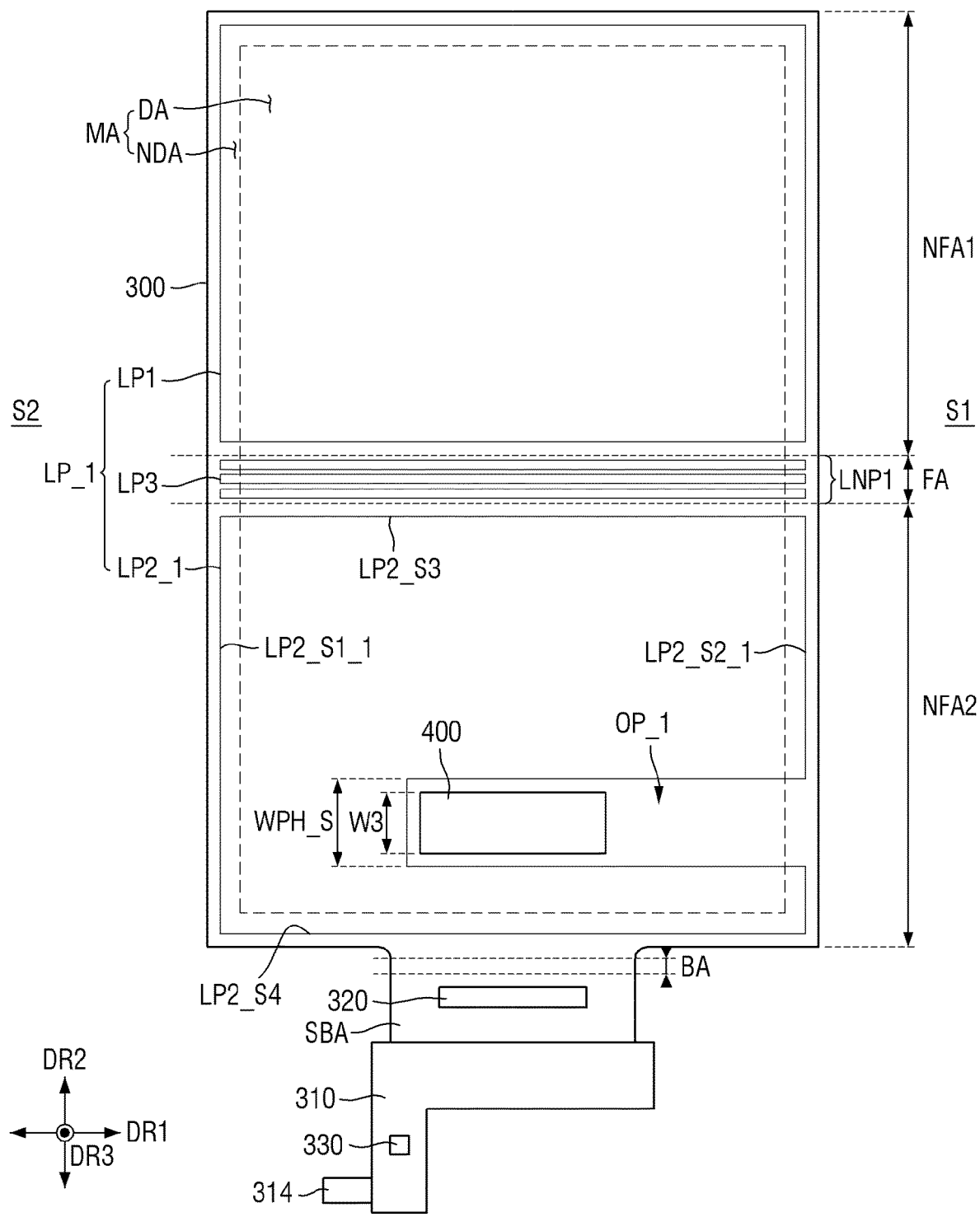
FIG. 10 is a plan view illustrating a display panel, a metal plate, a display circuit board, and a display driving circuit of a display device according to an embodiment.

FIG. 10 is a plan view illustrating a display panel, a metal plate LP_1, a display circuit board, and a display driving circuit of a display device according to an embodiment. FIG. 11 is a plan view illustrating a display panel, a metal plate LP_2, a display circuit board, and a display driving circuit of a display device according to an embodiment. FIG. 12 is a plan view illustrating a display panel, a metal plate LP_3, a display circuit board, and a display driving circuit of a display device according to an embodiment.

Referring to FIG. 10, the display device according to the current embodiment is different from the display device of FIG. 3 in that an open part OP_1 is formed to be open from a part of a long side of the metal plate LP_1 on the first side S1 in the first direction DR1.

The open part OP_1 may be formed to be open from a short side LP2_S2_1 of the second metal plate LP2_1 on the first side S1 in the first direction DR1.

Figure 11:
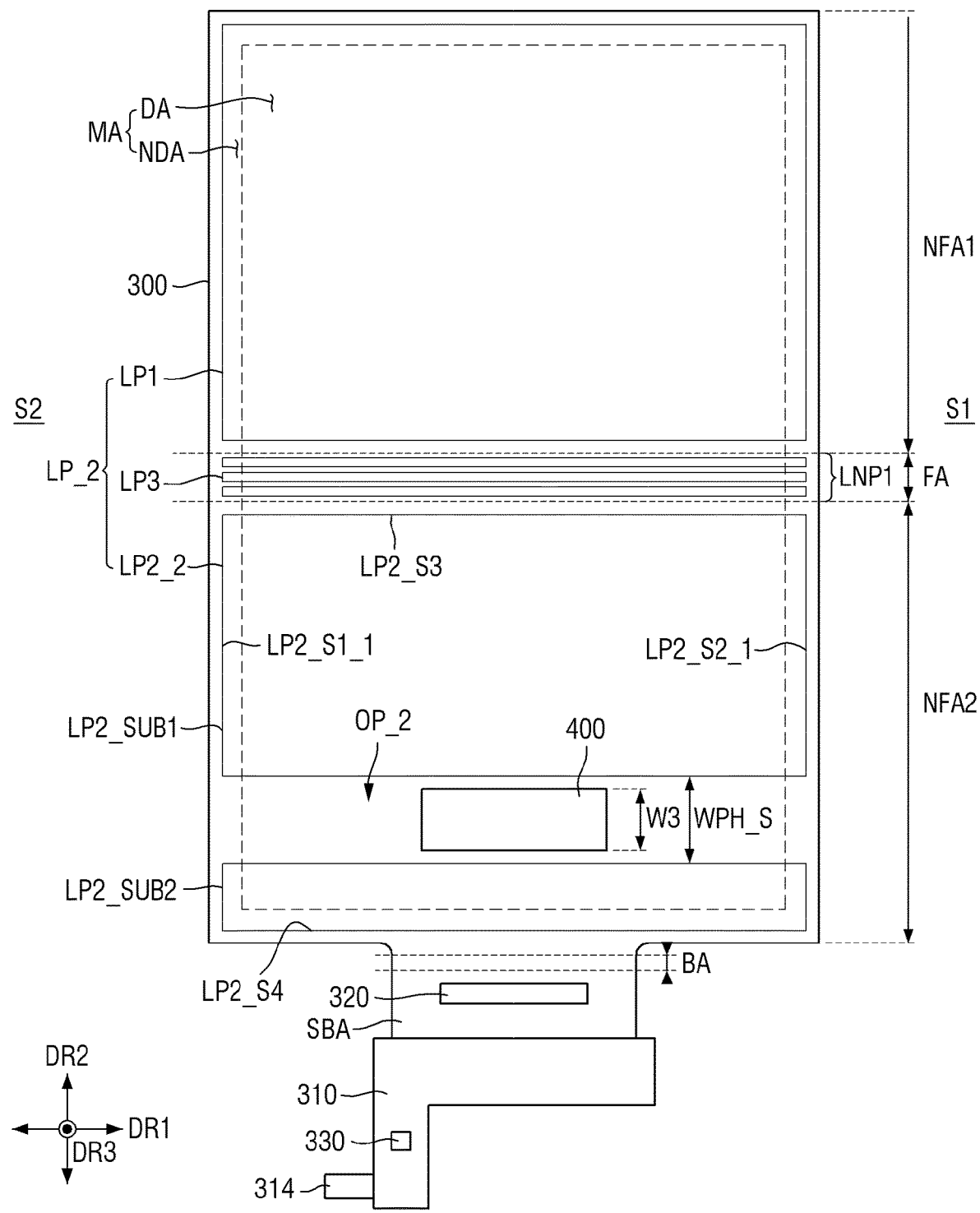
FIG. 11 is a plan view illustrating a display panel, a metal plate, a display circuit board, and a display driving circuit of a display device according to an embodiment.

Referring to FIG. 11, the display device according to the current embodiment is different from the display device of FIG. 3 in that an open part OP_2 is formed to be open from each of a long side of the metal plate LP_2 on the first side S1 in the first direction DR1 and a long side of the metal plate LP_2 on the second side S2 in the first direction DR1.

That is, the open part OP_2 may be formed to be open from each of a short side LP2_S2_1 of a second metal plate LP2_2 on the first side S1 in the first direction DR1 and a short side LP2_S1_1 of the second metal plate LP2_2 on the second side S2 in the first direction DR1. The open part OP_2 may completely penetrate the second metal plate LP2_2 along the first direction DR1. Therefore, as illustrated in FIG. 11, the second metal plate LP2_2 may include a first sub-metal plate LP2_SUB1 located above the open part OP_2 in the second direction DR2 (or a first side of a fingerprint sensor 400 in the second direction DR2) and a second sub-metal plate LP2_SUB2 located below the open part OP_2 in the second direction DR2 (or a second side of the fingerprint sensor 400 in the second direction DR2).

Figure 12:
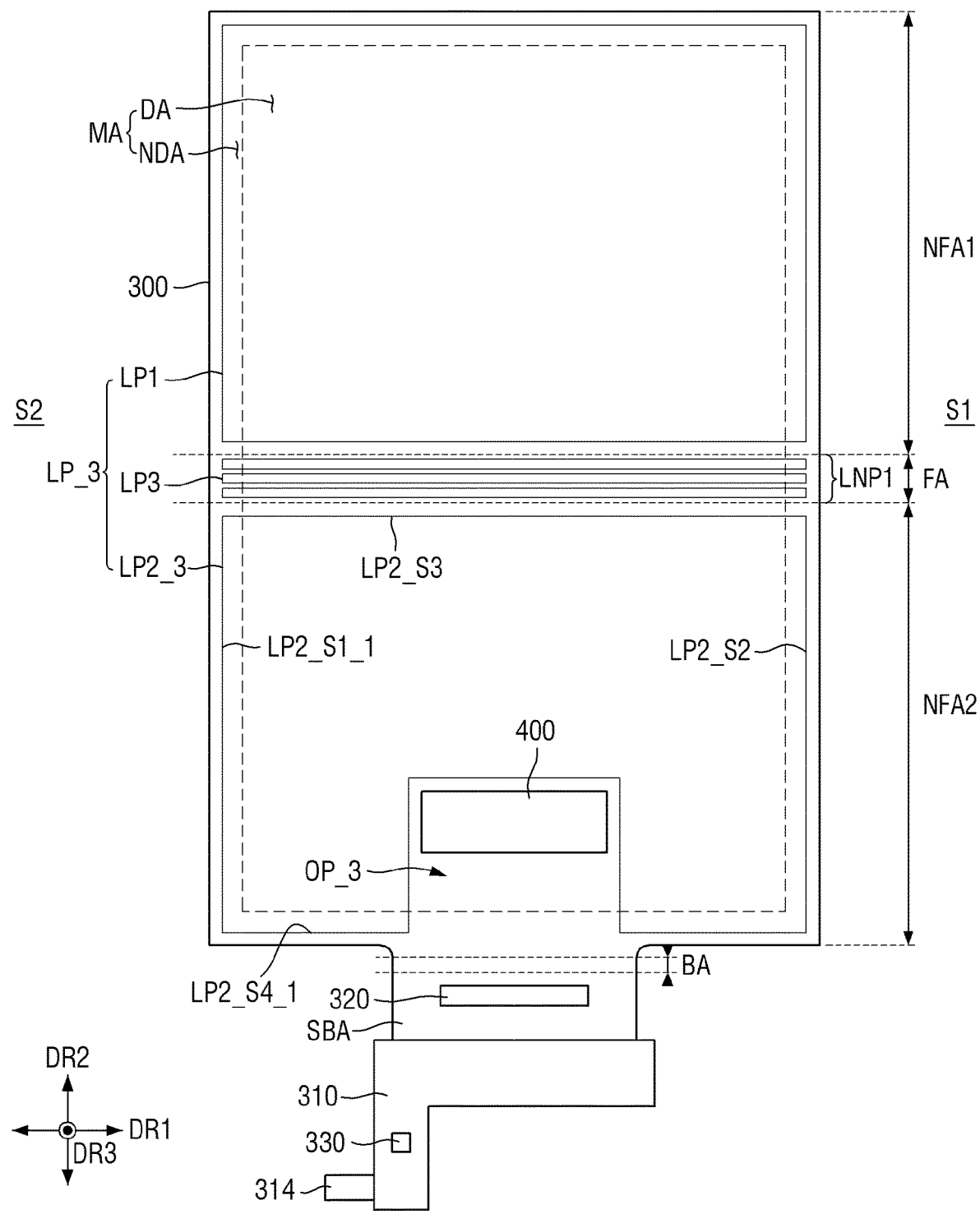
FIG. 12 is a plan view illustrating a display panel, a metal plate, a display circuit board, and a display driving circuit of a display device according to an embodiment.

Referring to FIG. 12, the display device according to the current embodiment is different from the display device of FIG. 3 in that an open part OP_3 is formed to be open a long side LP2_S4_1 of a second metal plate LP2_3 on the second side in the second direction DR2.

Figure 13:
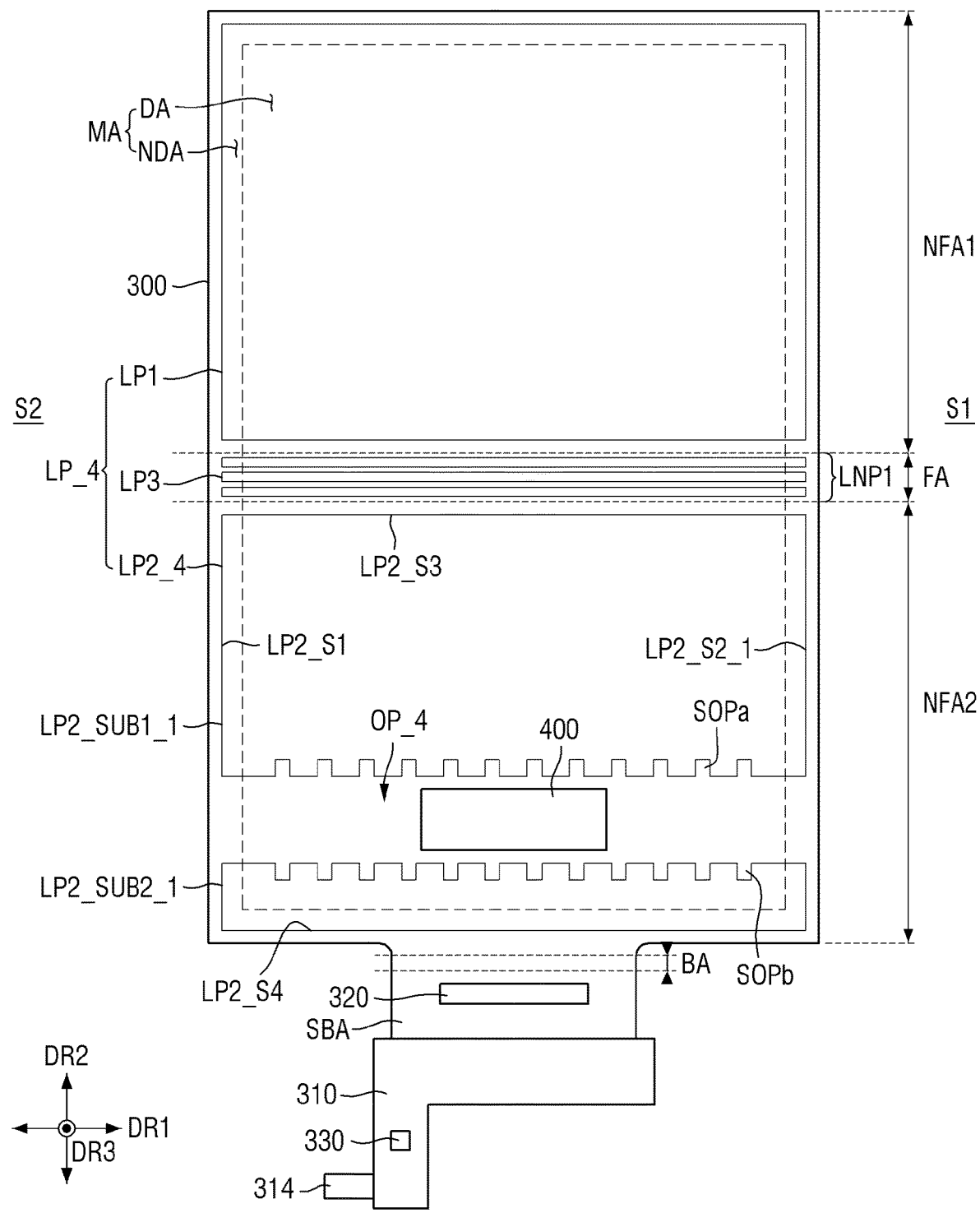
FIG. 13 is a plan view illustrating a display panel, a metal plate, a display circuit board, and a display driving circuit of a display device according to an embodiment.
Figure 14:
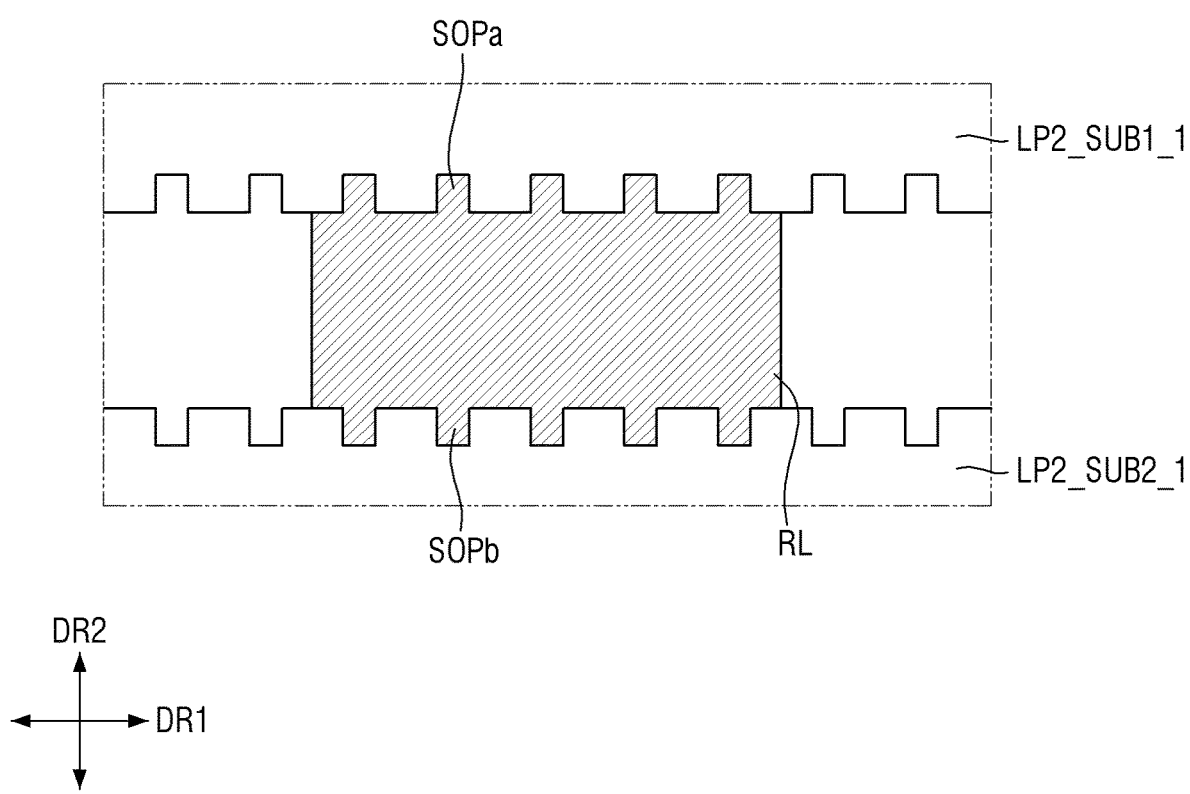
FIG. 14 is a plan view illustrating a filling member and a third metal plate of the display device of FIG. 13.

FIG. 13 is a plan view illustrating a display panel, a metal plate LP_4, a display circuit board, and a display driving circuit of a display device according to an embodiment. FIG. 14 is a plan view illustrating a filling member RL and a third metal plate of the display device of FIG. 13.

Referring to FIGS. 13 and 14, the display device according to the current embodiment is different from the display device of FIG. 11 in that a side surface of a first sub-metal plate LP2_SUB1_1 of a second metal plate LP2_4 of the metal plate LP_4 which faces a second sub-metal plate LP2_SUB2_1 includes a plurality of first sub-open parts SOPa recessed in a direction away from the second sub-metal plate LP2_SUB2_1, and a side surface of the second sub-metal plate LP2_SUB2_1 which faces the first sub-metal plate LP2_SUB1_1 includes a plurality of second sub-open parts SOPb recessed in a direction away from the first sub-metal plate LP2_SUB1_1.

In the current embodiment, an open part OP_4 may include the open part OP_2 described in FIG. 11, the first sub-open parts SOPa, and the second sub-open parts SOPb.

In plan view, the filling member RL may fill the first sub-open parts SOPa and the second sub-open parts SOPb.

According to the current embodiment, because each of the facing side surfaces of the sub-metal plates LP2_SUB1_1 and LP2_SUB2_1 further includes the sub-open parts SOPa or SOPb, the open part OP_4 may have a larger area than the embodiment of FIG. 11. Accordingly, a larger space can be secured for the placement of the filling member RL.

For example, each of the sub-open parts SOPa and SOPb may have, but is not limited to, a rectangular planar shape.

Figure 15:
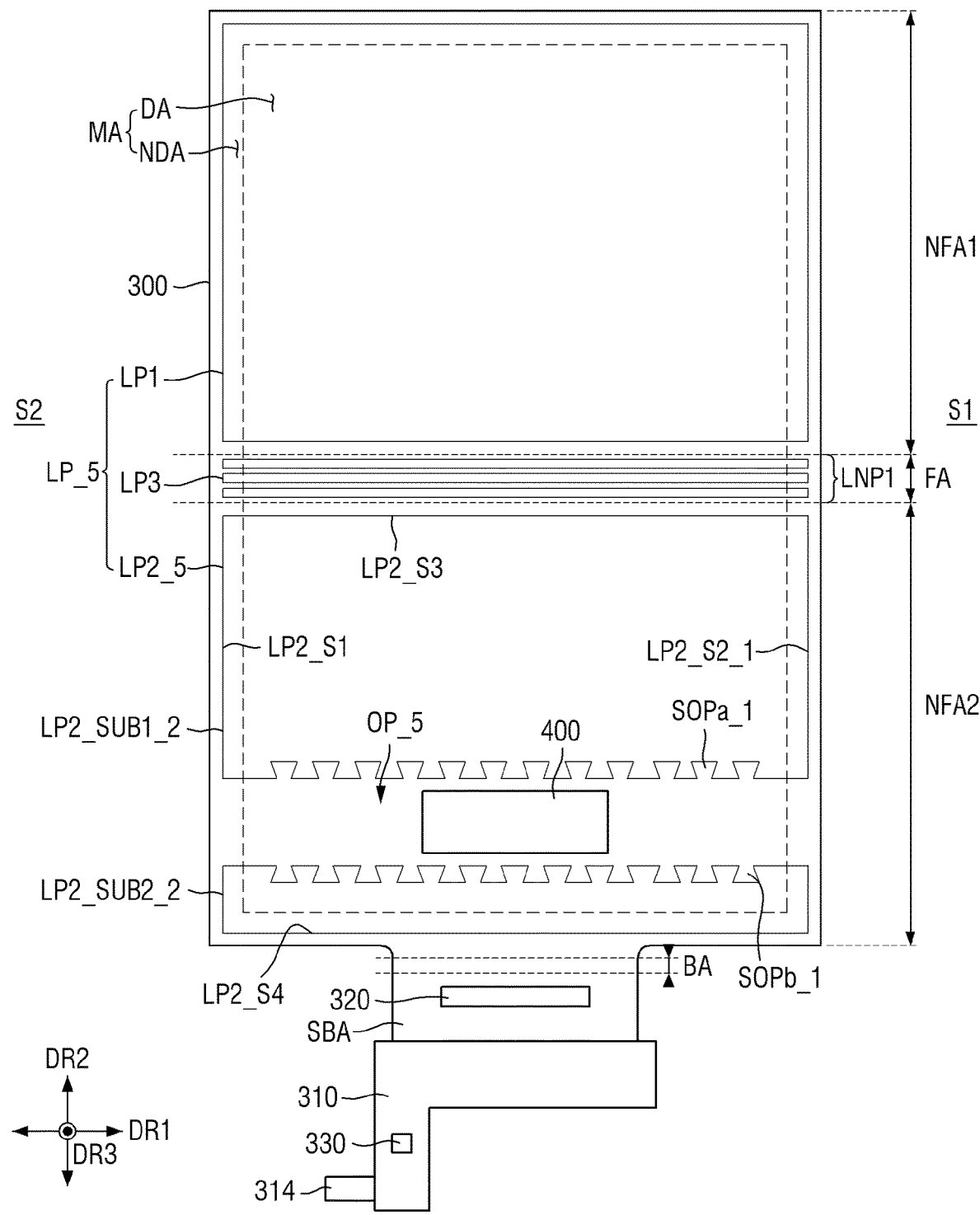
FIG. 15 is a modified example of the display device of FIG. 13.

FIG. 15 is a modified example of the display device of FIG. 13.

Referring to FIG. 15, the display device according to the current embodiment is different from the display device of FIG. 13 in that planar shapes of sub-open parts SOPa_1 and SOPb_1 of sub-metal plates LP2_SUB1_2 and LP2_SUB2_2 of a second metal plate LP2_5 of a metal plate LP_5 are different from those of the sub-open parts SOPa and SOPb of FIG. 13. A width, in the first direction DR1, of each of the sub-open parts SOPa_1 and SOPb_1 according to the current embodiment may decrease as the distance from a sub-metal plate LP2_SUB1_2 or LP2_SUB2_2 that the sub-open part SOPa_1 or SOPb_1 faces decreases. For example, each of the sub-open parts SOPa_1 and SOPb_1 may have a trapezoidal shape.

In other words, the width, in the first direction DR1, of each of the sub-open parts SOPa_1 and SOPb_1 according to the current embodiment increases as the distance from a sub-metal plate LP2_SUB1_2 or LP2_SUB2_2 that the sub-open part SOPa_1 or SOPb_1 faces increases. Therefore, an open part OP_5 can secure a larger area than the sub-open parts SOPa and SOPb of FIG. 13.

Figure 16:
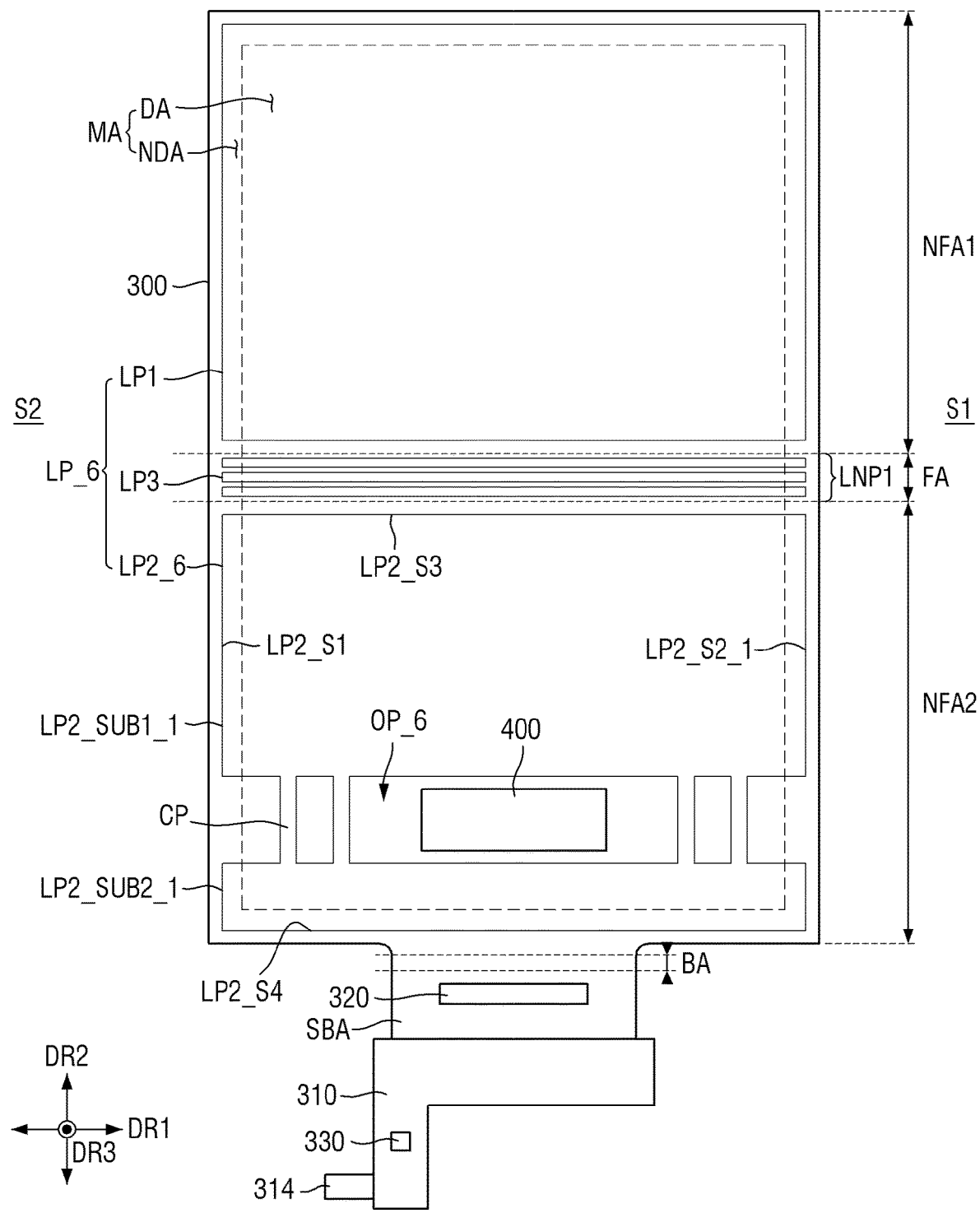

FIG. 16 is a plan view illustrating a display panel, a metal plate LP_6, a display circuit board, and a display driving circuit of a display device according to an embodiment.

Referring to FIG. 16, the display device according to the current embodiment is different from the display device of FIG. 11 in that a second metal plate LP2_6 of the metal plate LP_6 includes a first sub-metal plate LP2_SUB1_1 and a second sub-metal plate LP2_SUB2_1 which are spaced apart in the second direction DR2 with an open part OP_6 interposed between them and connection plates CP which extend along the second direction DR2 and connect the first sub-metal plate LP2_SUB1_1 and the second sub-metal plate LP2_SUB2_1.

According to the current embodiment, the first sub-metal plate LP2_SUB1_1 and the second sub-metal plate LP2_SUB2_1 are not completely physically separated but are physically connected through the connection plates CP. Therefore, the structural reliability of the metal plate LP_6 can be lengthened and secured. The area of the open part OP_6 according to the current embodiment may have a size obtained by subtracting the area of the connection plates CP from the area of the open part OP_2 of FIG. 11.

FIG. 17 is a plan view illustrating a display panel, a metal plate LP_7, a display circuit board, and a display driving circuit of a display device according to an embodiment.

Referring to FIG. 17, the display device according to the current embodiment is different from the display device of FIG. 11 in that each of sub-metal plates LP2_SUB1_1 and LP2_SUB2_1 of a second metal plate LP2_7 of the metal plate LP_7 includes protrusions TPa or TPb.

A side surface of a first sub-metal plate LP2_SUB1_1 which faces a second sub-metal plate LP2_SUB2_1 may include a plurality of first protrusions TPa protruding toward the second sub-metal plate LP2_SUB2_1, and a side surface of the second sub-metal plate LP2_SUB2_1 which faces the first sub-metal plate LP2_SUB1_1 may include a plurality of second protrusions TPb protruding toward the first sub-metal plate LP2_SUB1_1. The first protrusions TPa and the second protrusions TPb may be alternately disposed along the first direction DR1.

The area of an open part OP_7 according to the current embodiment may have a size obtained by subtracting the area of the protrusions TPa and TPb from the area of the open part OP_2 of FIG. 11.

FIG. 18 is a plan view illustrating a display panel 300, a metal plate LP_8, a display circuit board, and a display driving circuit of a display device according to an embodiment.

The display device according to the current embodiment is different from the display device of FIG. 11 in that a second metal plate LP2_8 of the metal plate LP_8 includes a first sub-metal plate LP2_SUB1 and a second sub-metal plate LP2_SUB2 which are spaced apart in the second direction DR2 with a fingerprint sensor 400 interposed between them and a third sub-metal plate LP2_SUB3 which is disposed between the first sub-metal plate LP2_SUB1 and the second sub-metal plate LP2_SUB2.

The third sub-metal plate LP2_SUB3 includes second line patterns LNP2 located on a second side of the fingerprint sensor 400 in the first direction DR1 and third line patterns LNP3 located on a first side of the fingerprint sensor 400 in the first direction DR1 in plan view. The second line patterns LNP2 may extend along the first direction DR1 and may be spaced apart from each other in the second direction DR2. The third line patterns LNP3 may extend along the first direction DR1 and may be spaced apart from each other in the second direction DR2.

Because the display device according to the current embodiment further includes the third sub-metal plate LP2_SUB3, the display panel 300 disposed on the metal plate LP_8 may be further supported. Accordingly, structural reliability can be further improved.

FIG. 19 is a plan view illustrating a display panel, a metal plate LP_9, a display circuit board, and a display driving circuit of a display device according to an embodiment.

Referring to FIG. 19, the display device according to the current embodiment is different from the display device of FIG. 18 in that a first sub-metal plate LP2_SUB1_2 of a second metal plate LP2_9 of the metal plate LP_9 includes a plurality of fourth line patterns LNP4 extending along the first direction DR1 and spaced apart along the second direction DR2, and a second sub-metal plate LP2_SUB2_2 includes a plurality of fifth line patterns LNP5 extending along the first direction DR1 and spaced apart along the second direction DR2.

According to the current embodiment, because each of the sub-metal plates LP2_SUB1_2 and LP2_SUB2_2 of the second metal plate LP2_9 includes a plurality of line patterns LNP4 or LNP5 spaced apart along the second direction DR2, even if a filling member RL thermally expands, the flexibility of the metal plate LP_9 can be further secured by a space provided between the line patterns LNP4 and LNP5.

FIG. 20 is a plan view illustrating a display panel, a metal plate LP_10, a display circuit board, and a display driving circuit of a display device according to an embodiment.

Referring to FIG. 20, the display device according to the current embodiment is different from the display device of FIG. 11 in that a second metal plate LP2_10 of the metal plate LP_10 includes a first sub-metal plate LP2_SUB1 and a second sub-metal plate LP2_SUB2 spaced apart in the second direction DR2, a side surface of the first sub-metal plate LP2_SUB1 which faces the second sub-metal plate LP2_SUB2 includes a plurality of first sub-open parts SOPa recessed in a direction away from the second sub-metal plate LP2_SUB2 and first protrusions TPa, each being located between adjacent first sub-open parts SOPa and protruding toward the second sub-metal plate LP2_SUB2, and a side surface of the second sub-metal plate LP2_SUB2 which faces the first sub-metal plate LP2_SUB1 includes a plurality of second sub-open parts SOPb recessed in a direction away from the first sub-metal plate LP2_SUB1 and second protrusions TPb, each being located between adjacent second sub-open parts SOPb and protruding toward the first sub-metal plate LP2_SUB1, wherein the first sub-open parts SOPa overlap the second protrusions TPb along the second direction DR2, and the second sub-open parts SOPb overlap the first protrusions TPa along the second direction DR2.

Because an open part of the display device according to the current embodiment includes not only an area overlapping a fingerprint sensor 400 but also a space between the sub-open parts SOPa and SOPb and the protrusions TPa and TPb overlapping in the second direction DR2, when a filling member RL thermally expands, a sufficient space for expansion can be secured.

FIG. 21 is a cross-sectional view illustrating a display device according to an embodiment.

FIG. 21 illustrates a cross section of the display device according to the embodiment, taken along the same area as line II-II' of FIG. 3.

Referring to FIG. 21, the display device according to the current embodiment is different from the display device of FIG. 8 in that a first side surface RLs of a filling member RL is spaced apart from a side surface LP2s of a second metal plate LP2 with a space SP between them.

According to the current embodiment, because the first side surface RLs of the filling member RL is spaced apart from the side surface LP2s of the second metal plate LP2 with the space SP between them, when the filling member RL thermally expands in a high-temperature environment, the filling member RL can thermally expand not only in the direction of a second side surface RLs of the filling member RL but also in the direction of the first side surface RLs.

The structure in which the first side surface RLs of the filling member RL is spaced apart from the side surface LP2s of the second metal plate LP2 with the space SP between them is not limited to the display device of FIG. 21 but is applicable to the embodiments described in FIGS. 1 through 20.

A display device including a fingerprint sensor according to embodiments can improve structural deformation due to thermal expansion of a filling member filling a through hole of a metal plate.

However, the effects of the inventive concepts are not restricted to the one set forth herein. The above and other effects of the inventive concepts will become more apparent to one of daily skill in the art to which the inventive concepts pertains by referencing the claims.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
    a display panel;
    a metal plate and a filling member which are disposed on a lower surface of the display panel, are disposed on a same layer, and include different materials; and
    a fingerprint sensor which is disposed on a lower surface of the filling member and is overlapped by the filling member in a thickness direction, wherein the fingerprint sensor is disposed entirely outside of the metal plate,
    wherein the metal plate includes a plurality of outlines extending in different directions in a plan view defined perpendicular to the thickness direction, one outline of the metal plate includes a plurality of sides extending along a first direction and a discontinuous part disposed between the sides, an open part recessed from the discontinuous part in a second direction intersecting the first direction is formed in the metal plate, and the filling member is located in the open part in the plan view, and
    wherein the filling member only partially fills the open part in the plan view, a side surface of the filling member is located inward from a first line connecting the sides via the discontinuous part, and a space is defined between the side surface of the filling member and the first line to allow for an expansion of the filling member into the space in at least the second direction.

2. The display device of claim 1, wherein a side surface of the filling member contacts a side surface of the metal plate, and another side surface of the filling member is exposed.

3. The display device of claim 2, wherein the filling member fills at least the open part.

4. The display device of claim 3, wherein a thickness of the filling member is greater than a thickness of the metal plate, and the filling member partially covers a lower surface of the metal plate.

5. The display device of claim 3, wherein a width of the open part is reduced from top to bottom.

6. The display device of claim 5, wherein an inclination angle between a lower surface of the metal plate and a side surface of the metal plate in contact with the open part is 40 to 50 degrees.

7. The display device of claim 1, wherein the fingerprint sensor comprises:
    an ultrasonic fingerprint sensor, the ultrasonic fingerprint sensor recognizes a fingerprint by comparing incident ultrasonic waves incident upward from the ultrasonic fingerprint sensor with fingerprint-reflected ultrasonic waves reflected from the fingerprint, and a thickness of the filling member is adjustable to form a resonant frequency between the incident ultrasonic waves and interface-reflected ultrasonic waves reflected at an interface between a member-sensor bonding member and the filling member.

8. The display device of claim 1, wherein the fingerprint sensor comprises:
    an optical fingerprint sensor, and the filling member has a transmittance of 90% or more for light.

9. The display device of claim 1, wherein the metal plate comprises:
    short sides extending along the second direction and long sides extending along the first direction, and the open part is formed by opening a part of at least one long side of the metal plate.

10. The display device of claim 9, wherein the display panel comprises:
    a first non-folding area, a second non-folding area located in the second direction of the first non-folding area and a folding area located between the first non-folding area and the second non-folding area, the metal plate includes a first metal plate overlapping the first non-folding area, a second metal plate overlapping the second non-folding area and a third metal plate overlapping the folding area, and the third metal plate includes a plurality of first line patterns extending along the second direction.

11. The display device of claim 10, wherein the second metal plate comprises:
    a first sub-metal plate and a second sub-metal plate spaced apart in the second direction, a side surface of the first sub-metal plate which faces the second sub-metal plate includes a plurality of first sub-open parts recessed in a direction away from the second sub-metal plate and a plurality of first protrusions, each being located between adjacent first sub-open parts and protruding toward the second sub-metal plate, and a side surface of the second sub-metal plate which faces the first sub-metal plate includes a plurality of second sub-open parts recessed in a direction away from the first sub-metal plate and a plurality of second protrusions, each being located between adjacent second sub-open parts and protruding toward the first sub-metal plate, wherein the first sub-open parts overlap the second protrusions along the first direction, and the second sub-open parts overlap the first protrusions along the first direction.

12. The display device of claim 1, wherein the metal plate comprises:
short sides extending along the second direction and long sides extending along the first direction, and the open part is formed by opening a part of at least one short side of the metal plate.

13. The display device of claim 1, wherein the open part functions to secure an area for expansion of the filling member when the filling member expands at a high temperature.

14. The display device of claim 1, wherein a coefficient of thermal expansion of the filling member has a value less than twice a coefficient of thermal expansion of the metal plate.

15. The display device of claim 14, wherein the coefficient of thermal expansion of the filling member has a value of 50 ppm or less.

16. The display device of claim 15, wherein the filling member comprises:
a liquid crystal plastic (LCP)-based polymer.

17. The display device of claim 1, further comprising:
a member-sensor bonding member which is disposed between the fingerprint sensor and the filling member and bonds the fingerprint sensor and the filling member together.

18. The display device of claim 1, wherein a side surface of the filling member is spaced apart from a side surface of the metal plate with a space therebetween, and the other side surface of the filling member is exposed.

19. A display device comprising:
a display panel which includes a first non-folding area, a second non-folding area adjacent to the first non-folding area in a second direction, and a folding area located between the first non-folding area and the second non-folding area in the second direction;
a metal plate and a filling member which are disposed on a lower surface of the display panel, are disposed on the same layer, and include different materials; and
a fingerprint sensor which is disposed on a lower surface of the filling member and is overlapped by the filling member in a thickness direction, wherein the fingerprint sensor is disposed entirely outside of the metal plate,
wherein the filling member is located in the metal plate in a plan view defined by the second direction and a first direction intersecting the second direction, and the metal plate includes a first metal plate overlapping the first non-folding area, a second metal plate overlapping the second non-folding area, and a third metal plate overlapping the folding area,
wherein the third metal plate includes a plurality of first line patterns extending along the first direction, and the second metal plate includes a first sub-metal plate and a second sub-metal plate spaced apart in the second direction with the fingerprint sensor interposed therebetween, and a third sub-metal plate disposed between the first sub-metal plate and the second sub-metal plate,
wherein the third sub-metal plate includes a plurality of individual second line patterns located on a second side of the fingerprint sensor in the first direction in the plan view and a plurality of individual third line patterns located on a first side of the fingerprint sensor in the first direction, portions of the filling member being in fluid communication with at least some of the second line patterns, and at least some of the second line patterns being spaced apart from the fingerprint sensor in the first direction, and
wherein the second line patterns extend along the first direction from one side of the third sub-metal plate to the fingerprint sensor and are spaced apart from each other in the second direction, and the third line patterns extend along the first direction from an opposite side of the third sub-metal plate to the fingerprint sensor and are spaced apart from each other in the second direction.

20. The display device of claim 19, wherein the first sub-metal plate comprises:
a plurality of fourth line patterns extending along the first direction and spaced apart along the second direction, and the second sub-metal plate includes a plurality of fifth line patterns extending along the first direction and spaced apart along the second direction.

21. The display device of claim 19, wherein a thickness of the filling member is greater than a thickness of the metal plate, and the filling member partially covers a lower surface of the metal plate.

22. A display device comprising:
a display panel;
a metal plate and a filling member which are disposed on a lower surface of the display panel, are disposed on a same layer, and include different materials; and
a fingerprint sensor which is disposed on a lower surface of the filling member and is overlapped by the filling member in a thickness direction, wherein the fingerprint sensor is disposed entirely outside of the metal plate,
wherein the metal plate includes short sides extending along a second direction and long sides extending along a first direction,
wherein the display panel includes a first non-folding area, a second non-folding area located in the second direction of the first non-folding area, and a folding area located between the first non-folding area and the second non-folding area,
wherein the metal plate includes a first metal plate overlapping the first non-folding area, a second metal plate overlapping the second non-folding area, and a third metal plate overlapping the folding area,
wherein the third metal plate includes a plurality of first line patterns extending along the second direction,
wherein the fingerprint sensor is disposed in an open part in a plan view,
wherein the second metal plate includes a first sub-metal plate and a second sub-metal plate spaced apart in the second direction with the open part interposed therebetween,
wherein a side surface of the first sub-metal plate which faces the second sub-metal plate includes a plurality of first sub-open parts recessed in a direction away from the second sub-metal plate, and a side surface of the second sub-metal plate which faces the first sub-metal plate includes a plurality of second sub-open parts recessed in a direction away from the first sub-metal plate, portions of the filling member being in fluid communication with at least some of the first sub-open parts, and at least some of the first sub-open parts being spaced apart from the fingerprint sensor in the second direction, and
wherein a side surface of the first sub-metal plate which faces the second sub-metal plate includes a plurality of first protrusions extending toward the second sub-metal plate and into corresponding ones of the second sub-open parts in the second sub-metal plate.

23. The display device of claim 22, wherein the filling member fills the first sub-open parts and the second sub-open parts in the plan view.

24. The display device of claim 22, wherein the second metal plate further comprises:
a connection plate extending along the second direction and connecting the first sub-metal plate and the second sub-metal plate.

25. The display device of claim 22, wherein
a side surface of the first sub-metal plate which faces the second sub-metal plate includes a plurality of first protrusions protruding toward the second sub-metal plate, and a side surface of the second sub-metal plate which faces the first sub-metal plate includes a plurality of second protrusions protruding toward the first sub-metal plate.

26. The display device of claim 25, wherein the first protrusions and the second protrusions are alternately disposed along the first direction.

* * * * *